United States Patent [19]

Gilligan

[11] Patent Number: 4,497,020
[45] Date of Patent: Jan. 29, 1985

[54] SELECTIVE MAPPING SYSTEM AND METHOD

[75] Inventor: Thomas J. Gilligan, Rolling Hills Estates, Calif.

[73] Assignee: Ampex Corporation, Redwood City, Calif.

[21] Appl. No.: 279,204

[22] Filed: Jun. 30, 1981

[51] Int. Cl.³ ............................................. G06F 9/30
[52] U.S. Cl. .................................................... 364/200
[58] Field of Search .......................................... 371/10;
364/200 MS File, 900 MS File; 365/200

[56] References Cited

U.S. PATENT DOCUMENTS

| | | | |
|---|---|---|---|
| 3,222,653 | 12/1965 | Rice | 340/172.5 |
| 3,234,521 | 2/1966 | Weisbecker | 364/200 |
| 3,245,049 | 4/1966 | Sakalay | 364/200 |
| 3,311,887 | 3/1967 | Muroga | 364/200 |
| 3,311,888 | 3/1967 | Hanan et al. | 364/200 |
| 3,331,058 | 7/1967 | Perkins, Jr. | 340/172.5 |
| 3,350,690 | 10/1967 | Rice | 340/172.5 |
| 3,422,402 | 1/1969 | Sakalay | 340/172.5 |
| 3,432,812 | 3/1969 | Elfant | 340/172.5 |
| 3,434,116 | 3/1969 | Anacker | 364/200 |
| 3,541,525 | 11/1970 | Gange | 340/172.5 |
| 3,544,777 | 11/1967 | Winkler | 235/153 |
| 3,633,175 | 1/1972 | Harper | 340/172.5 |
| 3,675,215 | 7/1972 | Arnold et al. | 364/200 |
| 4,058,851 | 11/1977 | Schueneman | 364/200 |
| 4,310,901 | 1/1982 | Harding et al. | 365/200 |

FOREIGN PATENT DOCUMENTS

| | | |
|---|---|---|
| 0066083A1 | 8/1982 | European Pat. Off. . |
| 0059309A2 | 8/1982 | European Pat. Off. . |
| 1026897 | 4/1966 | United Kingdom . |
| 1117970 | 6/1968 | United Kingdom . |
| 1451814 | 10/1976 | United Kingdom . |
| 1472885 | 5/1977 | United Kingdom . |
| 1495332 | 12/1977 | United Kingdom . |
| 1528100 | 10/1978 | United Kingdom . |
| 1531528 | 11/1978 | United Kingdom . |

Primary Examiner—Harvey E. Springborn
Attorney, Agent, or Firm—Harry G. Thibault; Joel D. Talcott

[57] ABSTRACT

In a highly flexible but economical mapping system and method, a different multidigit source code is assigned to each element in a first set of elements containing a subset of elements to be mapped. The digits of an assigned source code are grouped into at least two different groups. For each element to be mapped, a multidigit destination code is stored identifying each mapped element within a second set of elements to which it is to be mapped. Each digit of the destination code is stored in association with a state that is definable by a group of digits of the source code. Upon receipt of a source code, if it is detected as representing an element to be mapped, the stored destination code associated therewith is retrieved and substituted for the source code to effect the mapping.

28 Claims, 10 Drawing Figures

FIG.2 ADDRESS TRANSLATOR 20

FIG.9

| A KEY DATA | 0 | 1 | 2 | 3 | 4 | 5------63 |
|---|---|---|---|---|---|---|
| 15 | | | | | | |
| 14 | | | | | | |
| 13 | | | | | | |
| 12 | | | | | | |
| 11 | | | | | | |
| 10 | | | | | | |
| 9 | A0  0 | | | | | |
| 8 | A17  1<br>B27 | | | | | |
| 7 | A16  1<br>B17 | | | | | |
| 6 | A14  1<br>B5 | | | | | |
| 5 | A13  1<br>B10 | | | | | |
| 4 | A10  1<br>B11 | | | | | |
| 3 | A5  1<br>B26 | A23  1<br>B11 | A20  1<br>B6 | | | |
| 2 | A36  2<br>B15,23 | A18  1<br>B27 | A19  1<br>B27 | | | |
| 1 | A35  3<br>B4,6,18 | A6  1<br>B6 | A4  2<br>B4,11 | A25  2<br>B4,7 | | |
| 0 | A27  4<br>B19,20,21,22 | A30  4<br>B4,17,18,19 | A29  3<br>B17,18,19 | A31  3<br>B17,18,19 | | |

A TRANSLATION DATA

SELECTIVE MAPPING SYSTEM AND METHOD

CROSS REFERENCE TO RELATED APPLICATIONS

This application is related to "METHOD OF SELECTING PROM DATA FOR SELECTIVE MAPPING SYSTEM," by Y. T. Chow and Thomas J. Gilligan, U.S. Pat. No. 4,435,754, Ser. No. 279,234, filed June 30, 1981, and application Ser. No. 269,474, filed June 2, 1981 for "RUGGED, VIBRATION RESISTANT MAGNETIC CORE STACK HAVING LOW MASS" by Thomas J. Gilligan.

BACKGROUND OF THE INVENTION

1. Field of the Invention

This invention relates to a system and method for mapping a selected subset of elements of a first set of elements into a second set of elements and more particularly to an address translator for a large core memory wherein each memory address corresponds to a different element and defective address locations form the subset.

2. Discussion of the Prior Art

Previously known mapping systems divide an input set of states which represent a set of elements into small groups and selectively provide a mapping for each group. This is relatively wasteful of capacity in that a maximum possible mapping capability must be provided for each group even though most of the capability will not be used. For example, 512K input states might be divided into 512 groups of 1K states each. If the average number of mappings is 4 per group, a mapping capacity on the order of 40 or more would be rquired for each group to accommodate worst case conditions. This results in a total mapping capacity of 20,000 although only 2000 states may actually be mapped. Furthermore, the larger the input set the greater the probability that the maximum capacity will be exceeded at one of the groups.

The present invention economically permits the mapping of the entire input set as a whole. The bigger the input set, the more efficient the hardware is and the less likely that the number of states to be mapped will exceed the anticipated maximum number of states.

The present system has particular advantage as an address translator for input addresses for a large memory wherein each address represents an input state or element. Up to now it has been necessary, whenever a memory defect occurs, to repair or replace the section of memory containing the defect. In the case of a semiconductor memory, this may result in the loss of many thousands of bits of memory capacity on a memory "chip" because of a single defect. In the case of a core memory tiny wires passing through hundreds of cores must be withdrawn, a defective core replaced and the wires rethreaded. Not only is this rework very expensive, but the process of withdrawing and rethreading the cores may inflict additional damage on the memory. To minimize rework, each core is pre-inspected or graded. This inspection is expensive and the extra handling required thereby inflicts extra damage on some of the cores.

The present invention has resulted in the building of a large 512K word by 18 bit core memory without grading the cores prior to stack assembly and without any rework after stack assembly. The elimination of stack rework has further facilitated an advantageous high density stack arrangement that would not be suitable if rework were required.

SUMMARY OF THE INVENTION

A selective mapping system according to the invention maps a predetermined subset of elements of a first set of elements into a second set of elements with elements of the first and second set being uniquely represented by multi-part encoded indicia providing a multi-digit code such as multi-bit binary encoded address lines. The encoded indicia are separated into two mutually exclusive orthogonal groups in which the states or elements of each group are independent of the states or elements of all other groups. A first translator is coupled to receive the first group of encoded indicia and, for each first group code state which identifies an element in the subset, to generate a first part of a multipart encoded indicia which uniquely identifies the element within the second set. A second translator is similarly coupled to receive the second group of encoded indicia and, for each second group code state which identifies an element in the subset to generate a remainder of the multipart encoded indicia which in combination uniquely identifies the element within the second set. A relationship detector is coupled to receive at least a portion of the multipart encoded indicia identifying elements in the second set and to generate a command signal when a received encoded state identifies an element in the subset. A multiplexer is coupled to receive the multi-part encoded indicia of the first set, the multipart indicia identifying the elements of the second set and the command signal, and to output the multipart encoded indicia of the first set in the absence of the command signal and to output the multi-part encoded indicia identifying the elements of the second set in response to the command signal.

More particularly the system includes a first translation store coupled to receive the first group of encoded indicia of elements in the first set and output a first translation signal representing a first translation code state which is the first part of the multi-part encoded indicia identifying the elements of the second set, a first key store coupled to receive the first group of encoded indicia of elements in the first set and output a first key signal representing a first key code state which is a multi-part encoded indicia which, in combination with the first translation code, provides a unique one-to-one mapping of elements of the first group of encoded indicia of the first set. A second translation store is coupled to receive the second group of encoded indicia of elements in the first set and output a second translation signal representing a second translation code state which is the remaining part of the multi-part encoded indicia identifying the elements of the second set, and a second key store is coupled to receive the second group of encoded indicia of elements in the first set and output a a second key signal representing a second key code state which is a multi-part encoded indicia which in combination with the second translation code state provides a unique mapping of elements of the second group of encoded indicia of the first set to the second set of elements. The system further includes a relationship detector implemented as a fault PROM and a comparator. The fault PROM includes address locations accessed by the first and second translation codes states and at each address location stores a third and a fourth key code state which correspond respectively to the first and second key code states which identify an element of the subset which is to be mapped to an element of the second set indicated by the first and second translation code states. The comparator receives the first, second, third and fourth key code states and outputs a command signal when the first key code state matches the third key code state and the second key code state matches the fourth key code state. The system may further include a multiplexer coupled to output the first and second groups of encoded indicia identifying the elements of the first set in the absence of the command signal and the first and second translation codes in response to the command signal.

BRIEF DESCRIPTION OF THE DRAWINGS

A better understanding of the invention may be had from a consideration of the following detailed description taken in conjunction with the accompanying drawings in which:

FIG. 9 is a two dimension A Key Data and A Translation Data map for the example in accordance with the invention.

DETAILED DESCRIPTION

Figure 1:
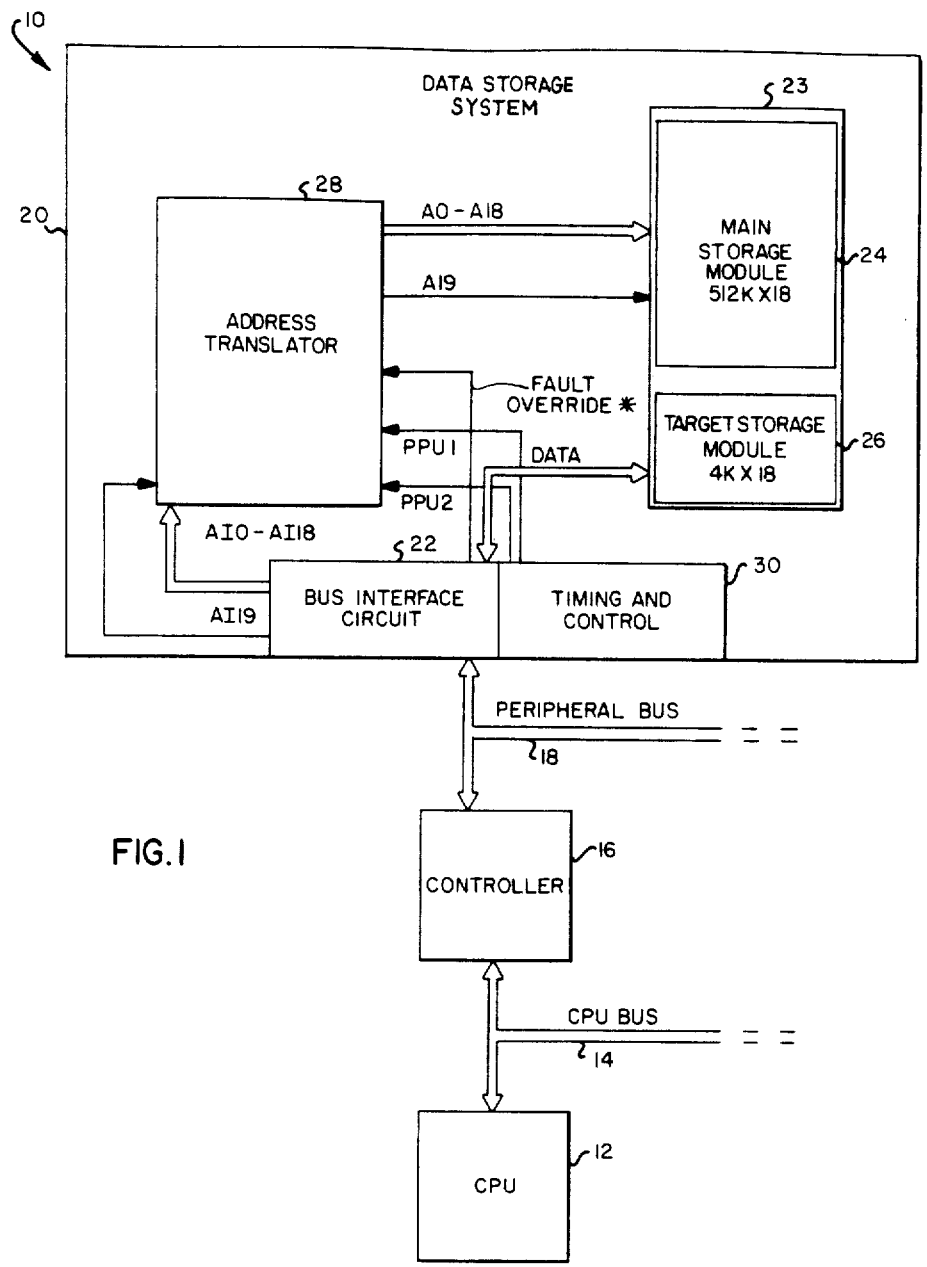
FIG. 1 is a block diagram of a data processing system utilizing a data store with an address translator in accordance with the invention.

Referring now to FIG. 1, a data processing system 10 in accordance with the invention includes a central processing unit 12 connected by a CPU bus 14 to a controller 16. The controller 16 is in turn connected by a peripheral bus 18 to a data storage system 20. In a conventional manner the CPU bus 14 may also connect to additional controllers or peripheral devices, I/O devices, or memory units. Similarly, the peripheral bus 18 may conventionally connect to other data storage units such as a disk drive or other data storage system such as the data storage system 20.

In general, the data storage system 20 need not be connected through a controller to the CPU bus but could be connected directly to the CPU bus or could otherwise be connected directly to CPU 12 or through a cache memory to CPU 12. However, the address translation feature of the present invention is particularly advantageous for use with a very large data store such as a large core memory manufactured by Ampex Corporation and sold under the trademark "MEGASTORE" for use as a head per track disk replacement or substitute. When so used, the data storage system 20 is coupled through a peripheral bus such as bus 18 to a disk drive controller such as controller 16. The data storage system 20 then includes a bus interface circuit 22 which particularly adapts the data storage system 20 to connection to the particular configuration and signal requirements of the peripheral bus 18. Advantageous embodiments MEGASTORE systems are described in U.S. Pat. No. 4,238,838 and in U.S. Pat. No. 4,096,583 which has been reissued as U.S. Pat. No. Re. 30,395. A further improvement has been described in application Ser. No. 269,474, filed June 2, 1981 for "RUGGED, VIBRATION RESISTANT MAGNETIC CORE STACK HAVING LOW MASS" by Thomas J. Gilligan.

The data storage system 20 further includes a bus interface 22, a data storage module 23 having a 512K word by 18 bit main storage module 24 and a 4K word by 18 bit target storage module 26, an address translator 28, and timing and control circuitry 30. The main and target storage modules 24, 26 are advantageously manufactured as a single core memory or other form of data store with a 20th memory address line A19 causing the selection of address locations within main storage module 24 when at logic 0 and the selection of address locations within the target storage module portion 26 when at logic 1. The main storage module portion 24 of data storage module 23 responds to 19 binary encoded memory address signals designated A0–A18 to select one of the 512K words in response to a memory access. Each address lines carries a two state or binary signal and represents one binary digit in an ordered set of digits representing a memory address. Similarly, when memory address signal A19 causes the selection of target storage module portion 26 of data storage module 23, memory address signals A0–A18 cause the selection of one of 4K words within target storage module 26. It will be appreciated that memory address signals A12–A18 are forced false and that only the least significant 12 memory address signals A0–A11 plus A19 are effective in the addressing of target storage module 26 since this is all that is required to select one word out of 4K words. The data storage module 23 and timing and control circuitry 30 are generally conventional in nature and respond to signals from peripheral bus 18 communicated through bus interface circuit 22 to perform data storage and retrieval operations at address locations indicated by memory address signals A0–A19.

Bus interface circuit 22 is conventional in nature and in particular will depend upon the configuration of peripheral bus 18. It operates to provide the necessary signal and timing relationships to meet the bus protocol required for communication on peripheral bus 18 and also to communicate data store access signals received over peripheral bus 18 to appropriate portions of data store 20.

In normal operation data storage system 20 appears to controller 16 as a 512K by 18 bit data store which is randomly accessible in response to 19 input address bits or conductors AI0–AI18. Each address conductor AI0–AI16 represents a different digit of a multidigit binary coded address input signal. Address translator 28 receives these 19 input address bits or signals defining one of a possible 512K encoded states and in response thereto outputs 20 memory address bits A0-A19. Most of the time address translator 28 merely operates to convert input addresses AI0-AI18 into corresponding memory addresses A0-A18 with address line A19 at logic 0 to address an indicated word within main storage module 24. However, address translator 28 is arranged to cause the diversion of addresses identifying selected locations within main storage module 24 to addresses identifying corresponding translated address locations within target storage module 26, with address output line A19 at logic 1 to indicate the selection of target storage module 26.

The address translator 28 is thus advantageously utilized to divert addresses selecting a defective word location with main storage module portion 24 to a corresponding nondefective word location within target storage module 26. The correspondence between defective locations within main storage module 24 and nondefective locations within target storage module 26 is preestablished in address translator 28 with the translation being transparent to controller 16 and CPU 12. That is, as far as controller 16 is aware it has sent to data storage system 20 an address for a location within main storage module 24 with the corresponding data being accessed. Controller 16 is unaware that the actual address has been diverted or translated to an operable storage location within target storage module 26.

Although the data storage system 20 responds to only 19 input address lines AI0-AI18 under normal operation, the 20th input address line AI19 corresponding to output line A19 is also connected to bus interface circuit 22 so that it may be driven by an external device. This 20th input address line and the signal thereon is utilized primarily in conjunction with a fault override * (*indicates a logically inverted signal level) signal which is also presented to external components through bus interface circuit 22 to permit the selective addressing of all addresses within data storage module 23. That is, with the fault override * signal at logic 0 the address translator 28 is effectively overriden to produce a direct correspondence between address inputs AI0-AI19 and A0-A19. Data storage module 23 thus appears as a 516K word by 18 bit memory with any of the words therein being addressable by the 20 address bits. During the testing phase it thus becomes possible for every word of the data storage module 23 to be written and read for testing purposes without the address translator 28 introducing an uncertainty as to exactly which word location within data storage module 23 is being accessed. Defective word locations within main storage module 24 can thus be logged along with defective word locations that might occur within target storage module 26. This unambiguous detection of defective word locations thus permits address translator 28 to be arranged to translate addresses for defective word locations within main storage module 24 into valid address word locations within target storage module 26 while avoiding defective address word locations within target storage module 26.

The data storage module 23 may be tested in a conventional manner to detect and log defective word locations as well as to establish optimum drive current and sense amplifier threshold operating points and margins therefor. Once the data storage system 20 is tuned or set to the optimum operating conditions, all defective word locations are noted or logged for use in arranging address translator 28 to divert addresses for defective word locations within main storage module 24 to addresses for valid word locations within target storage module 26.

In one specific example utilizing 9 mil ungraded cores with no rework after wiring, it was found that the optimum normal threshold was 3.05 millivolts with Y read current set at 180 milliamps and all other drive currents at 200 milliamps. With the sensing threshold margins established between 2.2 millivolts and 3.9 millivolts there were approximately 2262 defective word locations within main storage module 24 which required translation or mapping into valid word locations within target storage module 26. That is, as the actual sensing threshold was varied between the upper and lower margins there were 2262 addresses at which either a 1 was stored and read back as a 0 or a 0 was stored and read back as a 1 under worst case pattern conditions. It naturally happens that as the lower margin is decreased or as the upper margin is increased additional storage locations fail to operate properly. The present example was found to present an acceptable compromise between a reasonable number of errors and adequate operating margins to accommodate aging, temperature changes, and other factors which might affect operation of the memory.

Two power up PROM enable signals PPU 1 and PPU2 are generated by timing and control circuit 30 in response to a conventional module select signal which indicates the addressing of the particular main storage module 24. These signals are peripheral to the actual operation of address translator 28 and merely enable it during periods that it is actually receiving and translating or passing through input addresses and disable PROMs within address translator 28 when not actually being used in order to reduce power consumption. At the expense of greater power consumption the PROMs could be continuously enabled with the signals PPU1 and PPU2 being eliminated.

Figure 2:
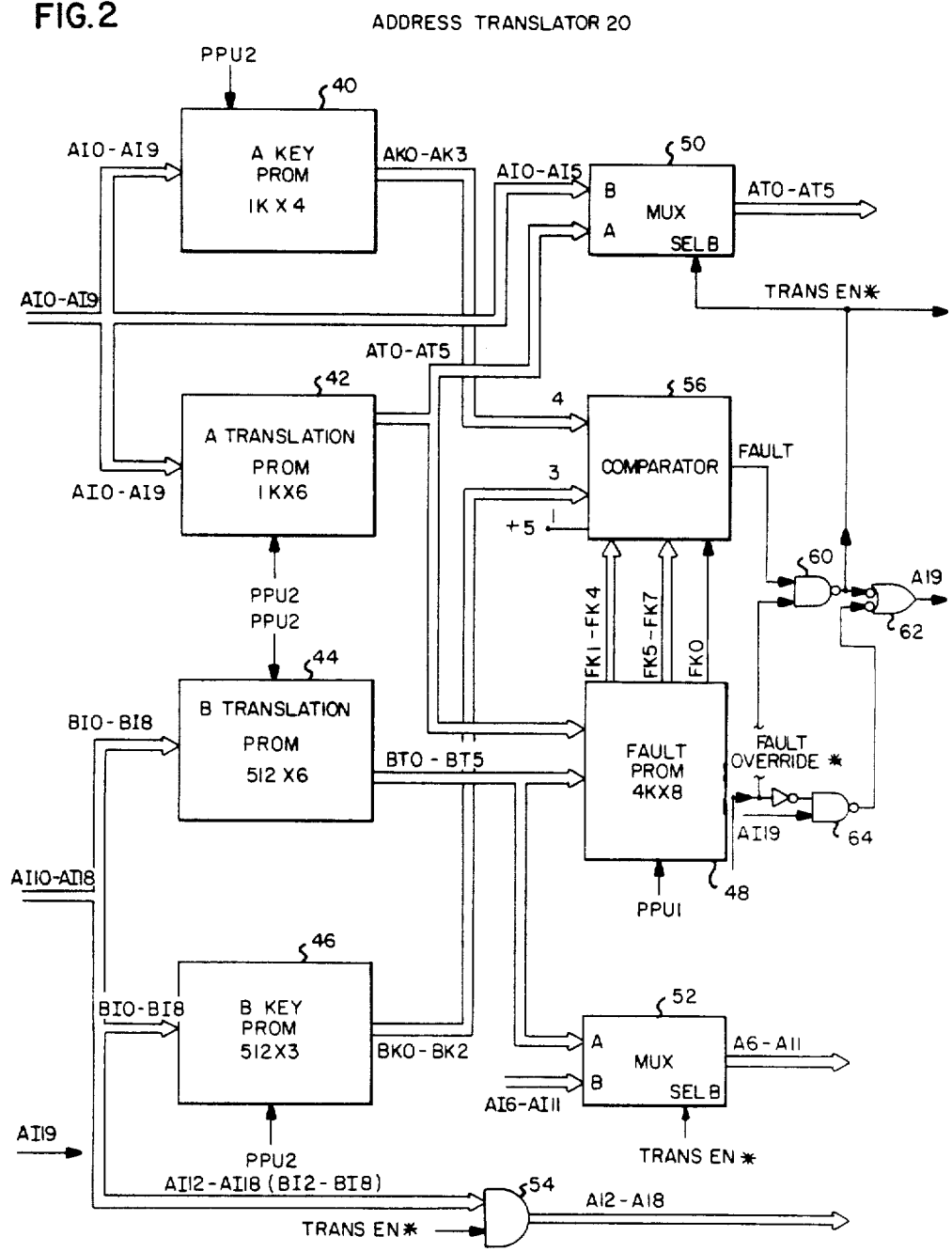
FIG. 2 is a schematic representation of a selective mapping system in accordance with the invention implemented as a memory address translator.

Referring now to FIG. 2, the address translator 28 includes a 1K word by 4 bit A key PROM 40, a 1K word by 6 bit A translation PROM 42, a 512 word by a 6 bit B translation PROM 44, a 512 word by 3 bit B key PROM 46, and a 4K word by 8 bit detection system or fault PROM 48. These PROMs 40-48 store the data required to detect the occurrence of an incoming address for a defective word location in main storage module 24 as well as the data for translating the address to an address for a valid word location within target storage module 26. Since the data is unique for each data storage system 20 and must be retained throughout the operating life of the data storage system 20, PROMs provide a convenient and relatively inexpensive apparatus for receiving and permanently retaining this data. It will be appreciated that subject to cost or system application considerations other forms of data storage such as EPROM, ROM and RAM could be substituted for the PROMs 40-48. In the event that a volatile type of storage is used, it will be apparent that it will be necessary to provide a means of preserving the data during times of shutdown for data storage system 20 or of writing the required data into the PROM substitutes as a part of an initialization procedure upon reactiving data storage system 20 following a shutdown. This problem is of course avoided by utilizing the permanent, nonvolatile storage characteristics of a PROM.

A first multiplexer 50 receives the least significant input address signals AI0-AI5 at its B input and the six translated address output data bits of PROM 42, AT0-AT5 at its A input. Similarly, multiplexer 52 receives the six input address signals AI6-AI11 at its B input and the six output translated address data bits from translation PROM 44 at its A input. A translate command signal TRANSEN* is normally high to drive the select B inputs of multiplexers 50 and 52 to cause the incoming address signals AI0-AI5 to be output as memory address signals A0-A5 and to cause the incoming address signals AI6-AI11 to be output as memory address signals A6-A11. Upon the occurrence of an active low translate enable signal TRANSEN*, the A inputs of multiplexers 50, 52 are activated to cause the data stored by A translation PROM 42 to drive the least significant memory address bits A0-A5 and to cause the data stored by B translation PROM 44 to drive the memory address bits A6-A11. A multiple input AND gate 54 receives address input signals AI12-AI18 and outputs them as A12-A18 in response to a logic 1 state of signal TRANSEN*, which occurs when no translation is to take place. Consequently, in the absence of a translation, input address signals AI12-AI18 are passed through as memory address signals A12-A18 corresponding thereto and in the event that an address is being translated the translated address signals A12-A18 are output at logic 0. These logic 0 address bits, in conjunction with address bit A19, properly point to the 4K word target storage module 26 and only the lowest order 12 bits are required to identify a word location within module 26.

It can thus be seen that in the event that an address translation is to occur, the six data bits output by A translation PROM 42 and the six data bits output by B translation PROM 44 combine to form the 12 memory address bits A0-A11 required to select a designated word location within target storage module 26. Simultaneously, these 12 address bits are communicated as address inputs to fault PROM 48 to select one of 4K word locations within fault PROM 48. Each word within fault PROM 48 thus corresponds on a 1 to 1 basis with a word within target storage module 26. If a word within a target storage module 26 has been assigned as a translated address for a defective input address, A and B key codes which are the same as key codes stored by A key PROM 40 and B key PROM 46 at locations accessed by the input address are stored by the fault PROM at the address corresponding to the translated address. The 8 bits of an addressed data word within fault PROM 48 are communicated to one set of inputs of a comparator 56 with four A key code bits designated FK0-FK3 being compared to the four data bits designated AK0-AK3 output by A key PROM 40, with three B key code data bits designated FK4 ∝ FK6 being compared to three data bits designated BK0-BK2 output by B key PROM 46 and with the eighth data bit designated FK7 being compared to a logic 1 voltage level of +5 V. Upon the occurrence of an identity among the eight pairs of data bits, comparator 56 generates an output designated Fault which indicates that the incoming address has selected a defective location within main storage module 24 and that an address translation is to occur.

Since in any given data storage system 20, a full 4K defective word locations are not likely to be found within main storage module 24, all 4K word locations within fault PROM 48 and target storage module 26 will not usually be utilized. The eighth bit of fault PROM 48 designated FK7 is thus utilized to indicate whether or not an addressed word location within fault PROM 48 is an address which is actually being utilized for translation. When an address input to fault PROM 48 is one which corresponds to an actual translation word location, the eighth data bit FK7 is set to logic 1 so that it can be successfully compared to the corresponding logic 1 input to comparator 56. This assumes that fault PROM 48 is manufactured with no data or "unburned" data outputs of all 0's. For other types of PROMs which are manufactured with an initial data state of all 1's it would be desirable to change the eighth bit to a 0 to indicate a defective address state so that an affirmative change in the PROM data would be required to indicate a defective address state requiring translation.

Since A translation PROM 42 receives ten binary encoded address bits AI0-AI9 corresponding to 1K words or states and outputs only six binary encoded translated data bits corresponding to 64 words or states, there are 16 address states (four binary encoded bits) corresponding to each translated address state output by A translation PROM 42. A key PROM 40 receives the ten input addresses and in response generates four binary encoded key data bits which define 16 states to permit the assignment of each of the 16 input addresses corresponding to each translated address state of A translation PROM 42 to one of the 16 states definable by A key PROM 40. Between them, the A key PROM 40 and A translation PROM 42 thus receive ten binary encoded input address bits and output ten binary encoded bits which permit a unique one to one and onto mapping of the 1024 states defined by the input address bits AI0-AI9 to 1024 states defined by the binary encoded output data bits AK0-AK3 and AT0-AT5 of A key PROM 40 and A translation PROM 42.

In a similar manner, the B translation PROM 44 and B key PROM 46 receive 9 binary encoded input address bits AI10-AI18 and provide a unique one to one and onto mapping of 512 states defined by these input address bits to 512 states defined by 9 binary encoded output bits designated BT0-BT5 and BK0-BK2. It will thus be appreciated that the translation PROMs 42-44 provide an address translation from the 19 input addresses AI0-AI18 to 12 output address bits A0-A11. That is, from the set of states defined by input addresses, the subset of states or word locations corresponding to memory defects, is translated or mapped into a second set of states corresponding to word locations within target storage module 26. It will further be apparent that there are 128 input address states (7 bits) for each of the 4K (12 bits) address states within fault PROM 48 and target storage module 26. The A and B key PROMs 40, 46 store 7 bits of key data which permit unique identification of one of the 128 address states corresponding to each combined output of the translation PROMs to be selected as a defective address location and translated to the target storage module 26.

For example, if address 0 is a defective address and is to be translated to the lowest order address within target storage module 26, the A and B translation PROMs 42, 44 would store all 0's at input address words 0 therein. Twelve bits of 0 translated address would thus cause a translation to the lowest order word location within target storage module 26 and also within fault PROM 48. 127 nondefective input address locations would also be assigned to the all 0 translated address state of translation PROMs 42, 44. However, each of these 127 nondefective addresses plus the one defective address would be assigned a unique combination of key data codes amongst the A and B key PROMs 40, 46.

The 0 word of fault PROM 48 would then have stored therein the unique combination of seven fault key data bits which match the combination of seven key data bits stored within A and B key PROMs 40, 46 which correspond to the one of 128 input address locations corresponding to translated address state all 0's of the translation PROMs which actually represents a defective storage location. Upon the occurrence of this address, comparator 56 detects a match between all eight pairs of inputs and generates the output signal fault.

This fault signal is coupled as one input to a NAND gate 60 whose output generates the translate command signal TRANSEN* which drives the seelect B inputs to multiplexers 50 and 52. This signal is also communicated to a NAND gate 62 whose output generates the 20th address signal A19 which determines the selection of either main storage module 24 at logic 0 or target storage module 26 at logic 1.

The FAULT OVERRIDE* signal is received from the bus interface for data storage system 20 and coupled to selectively disable NAND gate 60 when at logic 0. It is also inverted and coupled to a NAND gate 64 which receives as a second input the input address signal AI19 from the bus interface. The output of NAND gate 64 is coupled as a second input to NAND gate 62 so that upon the occurrence of a logic 0 for signal FAULT OVERRIDE*, the memory address signal A19 is generated in direct correspondence to the input address signal AI19 received at the bus interface circuit 22. It will be apparent that the occurrence of the logic 0 FAULT OVERRIDE* signal will cause the occurrence of a logic 1 TRANSEN* signal which will further cause the memory address bits A0-A18 to be generated in direct correspondence to the incoming address signals AI0-AI18 to permit addressing of all locations within data storage module 23 without interference by address translator 28.

While the address translator 28 theoretically accommodates 4K errors, there are certain restrictions upon the way in which translation addresses can be assigned to incoming addresses for defective locations. As a result, the probability of being able to properly assign address translations to accommodate all errors drops significantly when the number of errors exceeds approximately 3500 out of 4096. This results because there are a number of restrictions on the manner in which addresses for effective words within main storage module 24 are translated to addresses for words within target storage module 26. For example, dividing the input addresses AI0-AI9 into an A group and input addresses AI10-AI18 into a B group can be conceptualized as creating a two-dimensional matrix of word locations with the A addresses representing one dimension and the B addresses representing the second dimension. For every A dimension address state there are 9 bits or 512 B dimension address states and the A dimension address states can be thought of as 1024 lines, each representing an A address state, which intersect 512 B dimension lines, each representing a different unique B address state. It is thus possible that there will be up to 512 errors associated with each A dimension address. However, each A dimension address must be assigned a single unique 6 bit translation address by A translation PROM 42 and the multiple defective word locations which may be associated therewith must be uniquely distinguished by assigning each one a different translation address within B translation PROM 44. For example, if 6 defective word locations are associated with a given A dimension address, A translation PROM 42 may store data assigning the translated address of all 0's to that A dimension address. However, each of the associated B dimension addresses which represent defective word locations must be assigned a different B translation address within PROM 44. For example, if the B dimension defective addresses associated with the given A dimension address are 1, 10, 20, 33, 44, and 56, then the corresponding word locations within B translation PROM 44 would be assigned the respective data state 0, 1, 2, 3, 4 and 5. It is thus apparent that even though multiple error locations may be associated with a given A dimension address, that by assigning different data states within B translation PROM 44 to the different associated B dimension addresses, a unique 1 to 1 translation can be made from each incoming address which identifies a defective word location to a translated address within the target storage module 26. However, B translation PROM 44 outputs only 6 bits which define 64 unique states. It is thus possible to accommodate a maximum of 64 defective word locations associated with a given A dimension address line. Furthermore, for each B dimension translated address within B translation PROM 44 there can be associated only 8 different B dimension addresses which are distinguished by the three bits of B key PROM 46. Consequently, as the number of total defective word locations increases toward the maximum capacity of 4096, the probability of having available states within the B PROMs 44 and 46 to accommodate multiple errors associated within a given A dimension address decreases. Similarly, the probability of having available states within the A dimension PROMs 40, 42 to accommodate multiple defective word locations associated with a given A dimension address decreases. A statistical study has indicated that for the arrangement shown in FIG. 2 the probability of being able to accommodate a translation of all defective word locations decreases sharply as the number of defective word locations approaches 3500.

There are a number of restrictions on the assignment of data states to the A and B PROMs 40-46, which affect the accommodation of the theoretical maximum number of errors. These restrictions are that:

1. No more than 64 errors can be associated with each A dimension translate state or corresponding translation address code.
2. No more than 64 errors can be associated with each B dimension translate state or corresponding address code.
3. The assignment of an A dimension address code associated with a defective word location to a translated address within the A PROMs 40, 42 must be a 1 to 1 mapping.
4. The assignment of a B dimension address code associated with a defective word location to a translated address within the B PROMs 44,46 must be a 1 to 1 mapping.
5. The assignment of translated addresses within the A translation PROM 42 to the A dimension addresses and of the translated addresses within the B translation PROM 44 to B dimension addresses must be in such a way that no more than 1 input address defining a defective word location is associated with each combination of an A translation PROM 42 data state and a B translation PROM 44 data state.

Figure 3:
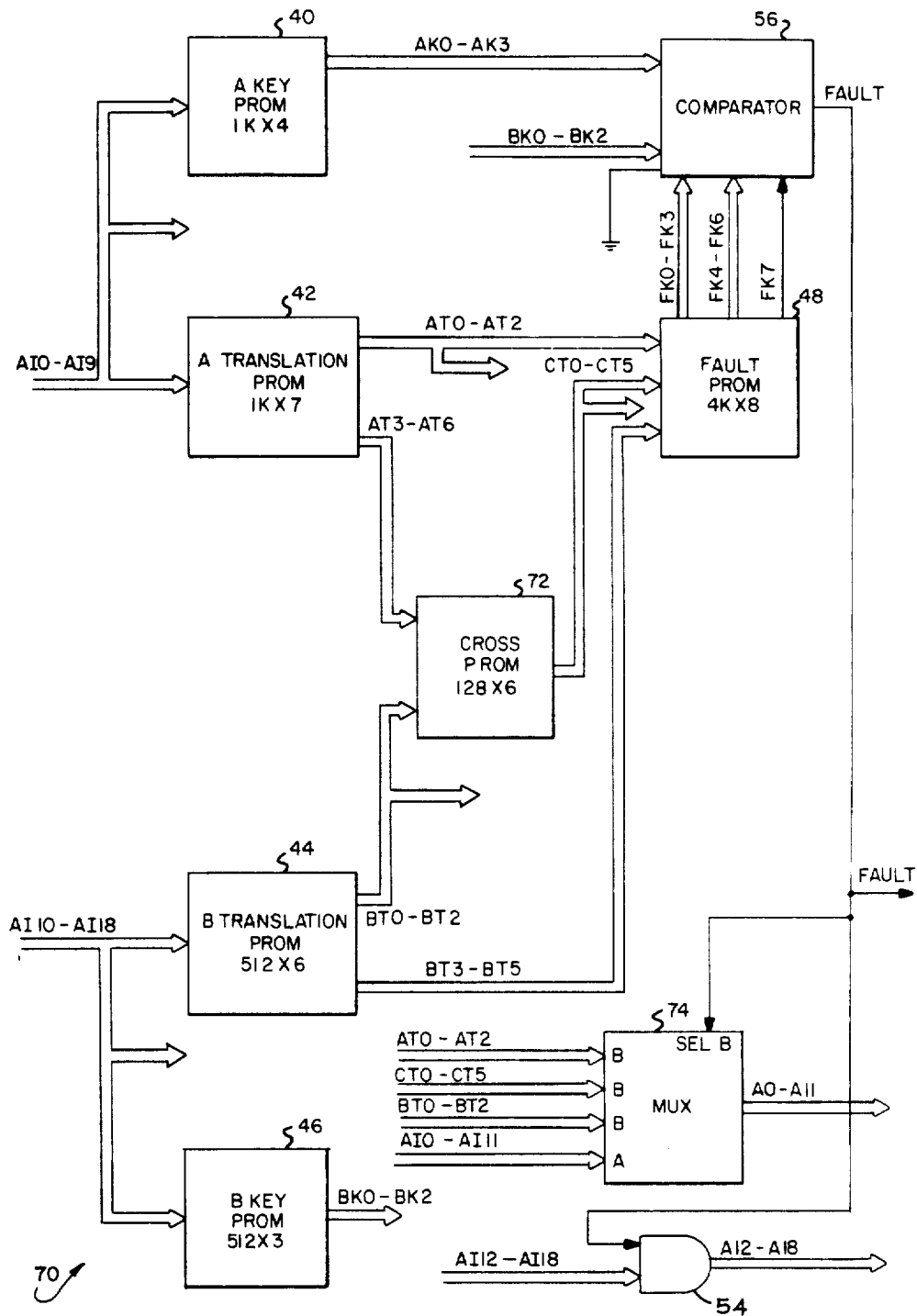
FIG. 3 is a schematic representation of an alternative embodiment of a memory address translator in accordance with the invention.

An alternative arrangement of an address translator 70 which affords more flexibility in the assignment of translation addresses to input addresses for defective word locations is illustrated in FIG. 3. Although represented in a slightly simplified form, the address translator 70 is essentially the same as address translator 28 shown in FIG. 2 except that an addressable data store referred to as a cross-PROM 72 is inserted between some of the data outputs of A translation PROM 42 and B translation PROM 44 and 6 of the address inputs to fault PROM 48. Cross-PROM 72 is a 128 word by 6 bit store which receives four of the output data bits designated AT3-AT6 from A translation PROM 42 as a first part address input and three of the output data bits designated BT0-BT2 from B translation PROM 44 as a second part address input. The remaining output data bits BT3-BT5 are coupled as address inputs to fault PROM 48. Cross-PROM 72 thus receives a total of 7 bits of address input which permit unique selection of the 128 words stored therein, only half of which will actually be used.

In general, the 12 bit input and 7 bit output of fault PROM 48 creates a two dimensional array of 4K by 128. Each of the 4K input address states or words must have mapped onto it 128 of the 512K system input address states, not more than one of which is to be translated. The 7 bit key data output determines which one is to be translated.

However, grouping of the input address bits into an A group (AI0-AI9) and a B group (AI10-AI19), while reducing the size of the first stage code assignment PROMS 40, 42, 44, 46, imposes restrictions on the assignment of input address states or words to memory address states or words. The FIG. 2 arrangement in effect creates two, two dimensional arrays, (AK0-AK3)×(AT0-AT5) and (BK0-BK2)×(BT0-BT5). Now instead of the freedom to arbitrarily assign the input address states corresponding to defective word locations to one of 4K translation addresses or states, the A group must be assigned to a 64×16 array and the B group must be assigned to a 64×8 array. Preservation of uniqueness requires that each of the 64 AT states (AT0-AT5) correspond to a maximum of 64 defects which must be distinguished by assigning each to a different one of 64 BT states (BT0-BT5). Similarly each 64 BT states (BT0-BT5) must correspond to a maximum of 64 defects which must be distinguished by assigning each to a different one of 64 AT states (AT0-AT5). These restrictions result in the difficulty of actually assigning more than 3500 errors out of a full capacity of 4096.

The use of cross-PROM 72 in FIG. 3 adds an additional dimension or degree of freedom to the assignment of input addresses to fault addresses that eases these restrictions. The statistical probability is that close to full error capacity can be mapped from the B input address group into the (BT0-BT5)×(BK0-BK2) second stage array. The limit on successful mapping will most likely occur upon the subsequent mapping of the A address group into the (AT0-AT5)×(AK0-AK3) second stage array.

In the arrangement of FIG. 3, a 7th output bit is added to A translation PROM 42, thus creating a 128×16 (AT0-AT6)×(AK0-AK2) array into which the A input lines or states may be mapped with relative statistical ease, leaving half of the output states unfilled.

The cross-PROM 72 now creates a set of five third stage arrays or dimensions, (AK0-AK3), (AT0-AT2), (CT0-CT5), (BT3-BT5) and (BK0-BK2).

Each A input address state corresponding to a defective memory location must be definable by a unique combination of (AK0-AK3), (AT0-AT2) and (CT0-CT5) while each B input address state corresponding to a defective memory location must be simultaneously definable by a unique combination of (CT0-CT5), (BT3-BT5) and (BK0-BK2). Cross-PROM 72 thus eliminates the strict requirements of a 64×64 array defined by the translation address (AT0-AT5) by (BT0-BT5) and adds additional flexibility which permits a given A or B input state to correspond to more than 64 fault locations or the assignment of input states for defective word locations that might not otherwise be possible to assign because of restrictions.

Figure 4:
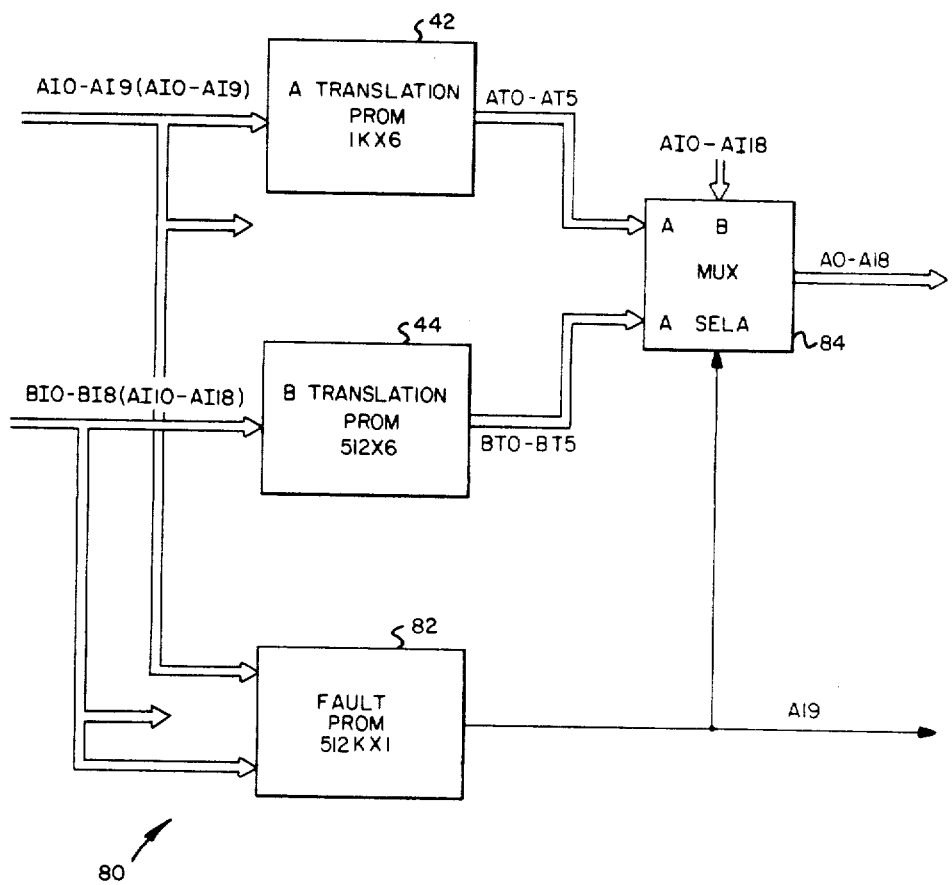
FIG. 4 is a schematic representation of an alternative embodiment of a memory address translator in accordance with the invention.

FIG. 4 illustrates an arrangement of an address translator 80 in which a 512K by 1 fault PROM 82 receives all 19 bits of input address information, AI0-AI18, and outputs a single bit defining translated address bit A19 and controlling a multiplexer 84. A logic 1 data output from fault PROM 82 accesses the target storage module 26 and causes multiplexer 84 to select the A inputs consisting of translated address bits AT0-AT5 from A translation PROM 42 and translated address bits BT0-BT5 from B translation PROM 44. The remaining A inputs corresponding to outputs A12-A18 are constrained to logic 0 by implementing the portion of multiplexer 84 outputting bits A12-A18 with an AND gate as shown for AND gate 54 in FIG. 2. Multiplexer 84 outputs the low order 19 bits of the translated address, A0-A18. In this arrangement, fault PROM 82 stores a one bit word for each addressable data store word. If the word is defective, a translated address is assigned thereto by the translation PROMs 42, 44 and a one is stored by fault PROM 82. If the location for a given input address is not defective, a 0 is stored by fault Prom 82 and the resulting logic 0 signal state of signal A19 causes multiplexer 84 to output the input address signals AI0-AI18 as storage module 23 address signals A0-A18. This arrangement is more flexible than the arrangements of FIGS. 2 and 3 in that it imposes no constraints upon the assignment of translated addresses to input addresses for defective word locations. The full capacity 4K words of translated storage in target storage module 26 can always be used. At the same time, the separation of the input addresses into two dimensions significantly reduces the size of the A and B translation PROMs 42, 44. The disadvantage of the arrangement of FIG. 4 is, of course, the large size of the fault PROM 82. 1981 prices for data storage elements implementing the fault PROM 82 renders the arrangement of FIG. 4 less economical than the arrangements of FIGS. 2 and 3.

Figure 5:
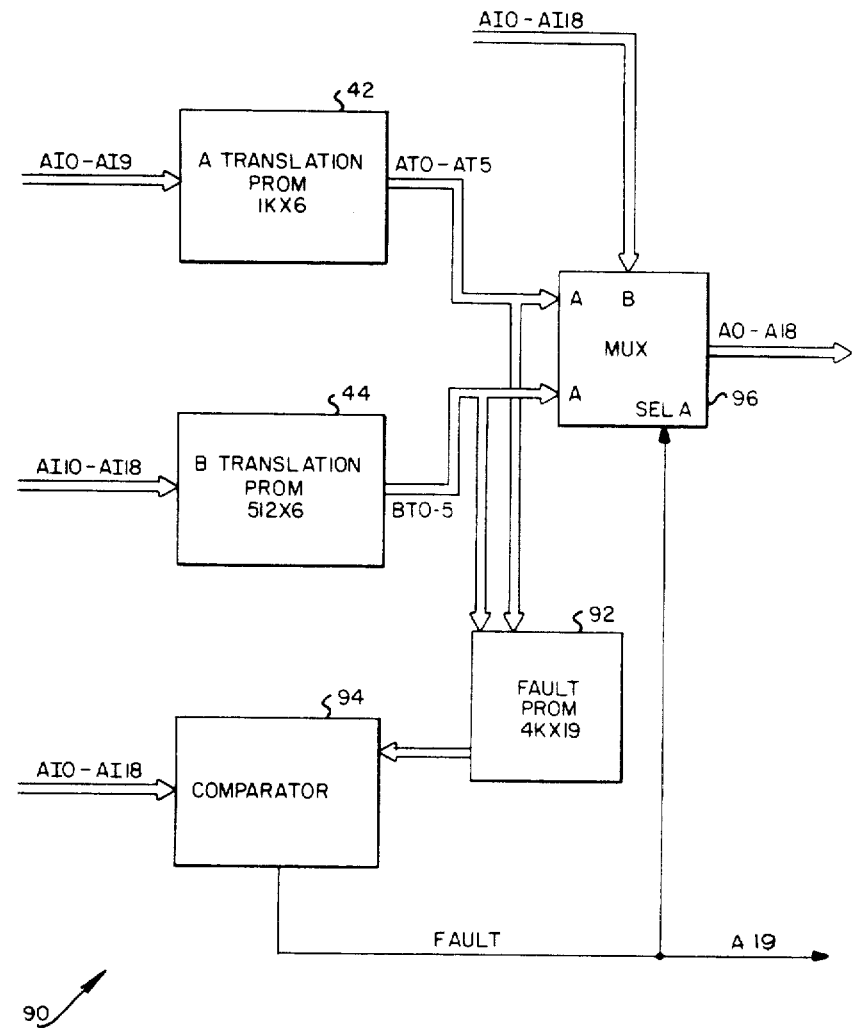
FIG. 5 is a schematic representation of an alternative embodiment of a memory address translator in accordance with the invention.

FIG. 5 illustrates an address translator 90 which is still another arrangement of an address translator in accordance with the invention which separates the incoming address signals into multidimensional fields. In the arrangement of FIG. 5, incoming addresses associated with a defective word location are translated to a location within target storage module 26 by the A and B translation PROMs 42, 44. A 4K by 19 fault PROM 92 stores the full 19 bit input addresses for the defective word locations which are being translated. A comparator 94 receives the 19 input address bits or signals as well as the 19 bits of data from fault PROM 92 and upon attainment of a full comparison generates an output signal designated fault which drives the most significant translated address bit A19 and also drives a select A input to a multiplexer 96. Multiplexer 96 receives translated address bits AT0-5 from A translation PROM 42 and translated address signals BT0-BT5 from B translation PROM 44 at its A inputs and the input address signals AI0-AI18 at its B input. Multiplexer 96 can include an AND gate generating the most significant output signals A12-A18 in the same manner as AND gate 54 in FIG. 2.

Consequently, each time the translated address output of the A and B translation PROMs 42, 44 addresses a word location within fault PROM 92 which stores the current input address, comparator 94 generates an output indicating that an address translation should be made and causes multiplexer 96 to substitute the 12 bit output of the A and B translation PROMs 42, 44 for the input address. It thus becomes possible to accommodate all addresses by assigning 128 address states to each of the 4K translation states stored by translation PROMs 42, 44 with fault PROM 92 indicating which one of the 128 addresses corresponds to a defective word location which is to be translated with the other 127 addresses being passed through multiplexer 96 unchanged.

Figure 6:
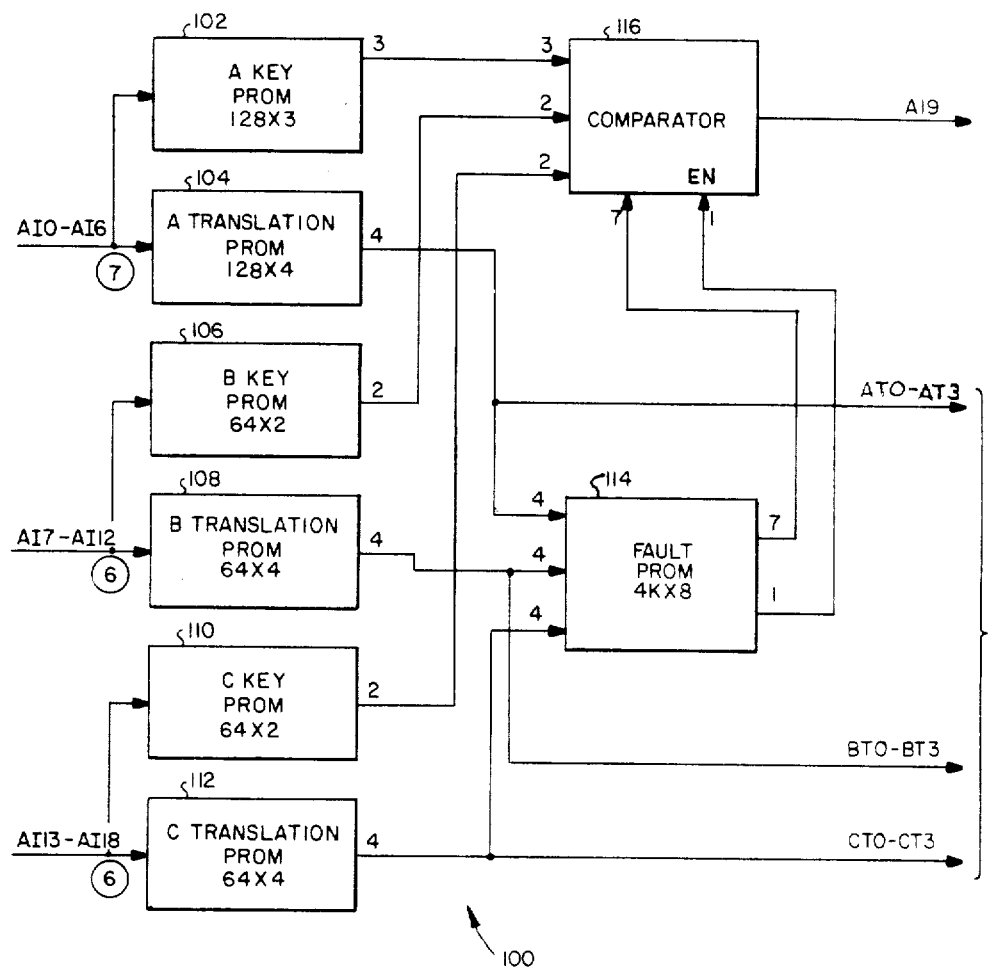
FIG. 6 is a schematic representation of a three-dimensional alternative embodiment of a memory address translator in accordance with the invention.

FIG. 6 illustrates an address translator 100 which is operationally similar to address translator 28 shown in FIG. 2 except that the input addresses are separated into three dimensions or groups designated A, B and C. Input addresses AI0-AI6 are communicated to a 128 word by 3 bit A key PROM 102 and also to a 128 word by 4 bit A translation PROM 104. The 7 data bits stored by the A PROMs 102, 104 provide a unique 1 to 1 and onto mapping of the input address bits AI0-AI6 into the data states defined by the 7 data bits of the A PROMs.

Input address bits AI7-AI12 are coupled to the address inputs of a 64 word by 2 bit B key PROM 106 and to a 64 word by 4 bit B translation PROM 108. The 6 data bits of the B key and translation PROMs 106, 108 provide a unique 1 to 1 and onto mapping of the 6 input address bits AI7-AI12 into the states defined by the 6 bits of data stored in the B PROMs. In a similar manner a C key PROM 110 and a C translation PROM 112 receive the remaining 6 input address bits AI13-AI18.

As with the arrangement of FIG. 2, the 12 data bits stored by the A, B and C translation PROMs 104, 108, and 112 are combined to generate the translated address signals AT0-AT11 which are communicated to a 4K by 8 fault PROM 114 which operates as a detector store storing key codes indicating which input address signal states are to be translated.

At each word location within fault PROM 114 there is stored 7 data bits identifying the particular key states identifying the one of a plurality of key states which are associated with the defective input address which is being translated to the particular word address within fault PROM 114. That is, three of the 7 data bits correspond to three bits stored by A key PROM 102, two of the data bits are associated with the two data bits stored by B key PROM 106 and the remaining two of the 7 data bits corresponds to the two data bits stored by C key PROM 110. The fault PROM 114 also stores an eighth data bit at each word location which indicates whether or not the particularly addressed word within fault PROM 114 represents a translation address or merely an unused address. This eighth bit is communicated as an enable signal to a comparator 116. Comparator 116, when enabled by an indication of a fault address from the eighth bit of fault PROM 114, compares the 7 bits from fault PROM 114 with the corresponding 7 bits from the key PROMs 102, 106, and 110 and generates at its output the most significant address translation signal A19. This 20th bit is also communicated to the select B input of a multiplexer having the same configuration as MUX 74 and AND gate 54 in FIG. 3 which responds by outputting the 12 data bits from the translation PROMs as the memory address signals A0-A11. In the absence of a logic 1 output from comparator 116 the multiplexer merely passes through the input address signals AI0-AI18 as the memory address signals A0-A18 respectively.

Separation of the input addresses into three dimensions rather than two dimensions does not change the basic operation of the translator 100, but does reduce the total cumulative size of the translation and key PROMs and affect the assignment of translation addresses. For example, in the two dimensional arrangement such as as is shown in FIG. 2, an A address line may have a maximum of 64 defective word locations thereon out of a possible 512. In the arrangement shown in FIG. 6, the A dimension must be conceptualized as combining separately and independently with both the B dimension and the C dimension to define one of 128 BC planes. Each BC plane representing a defective address location must be assigned to one of 16, 16×16 BT CT planes, thus accommodating up to 256 errors in a single BC plane out of 4096 input address states. Similarly, each 128×64 AB plane representing a defective address location must be assigned to one of 16 AT BT planes and each 128×64 AC plane representing a defective address location must be assigned to one of 16 AT CT planes.

Figure 7:
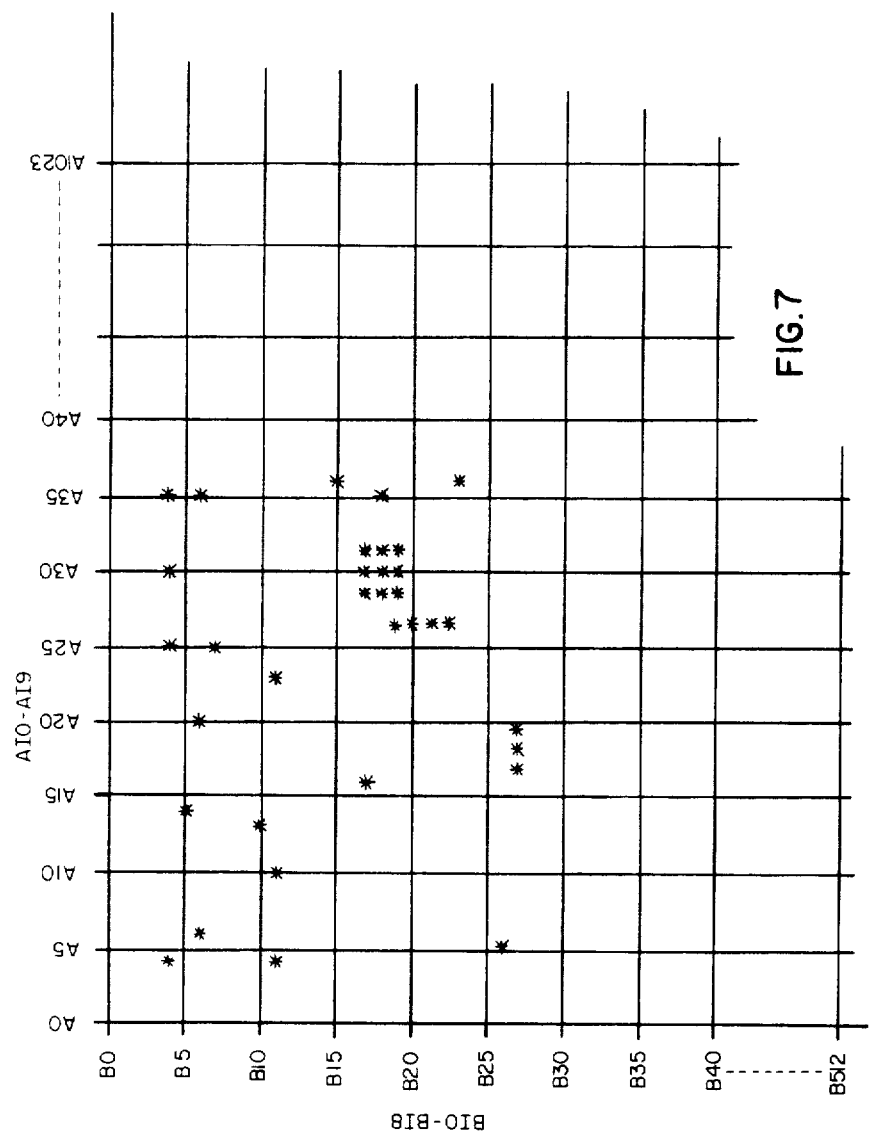
FIG. 7 is a two dimension memory map illustrating addresses to be translated for an example in accordance with the invention.
Figure 8:
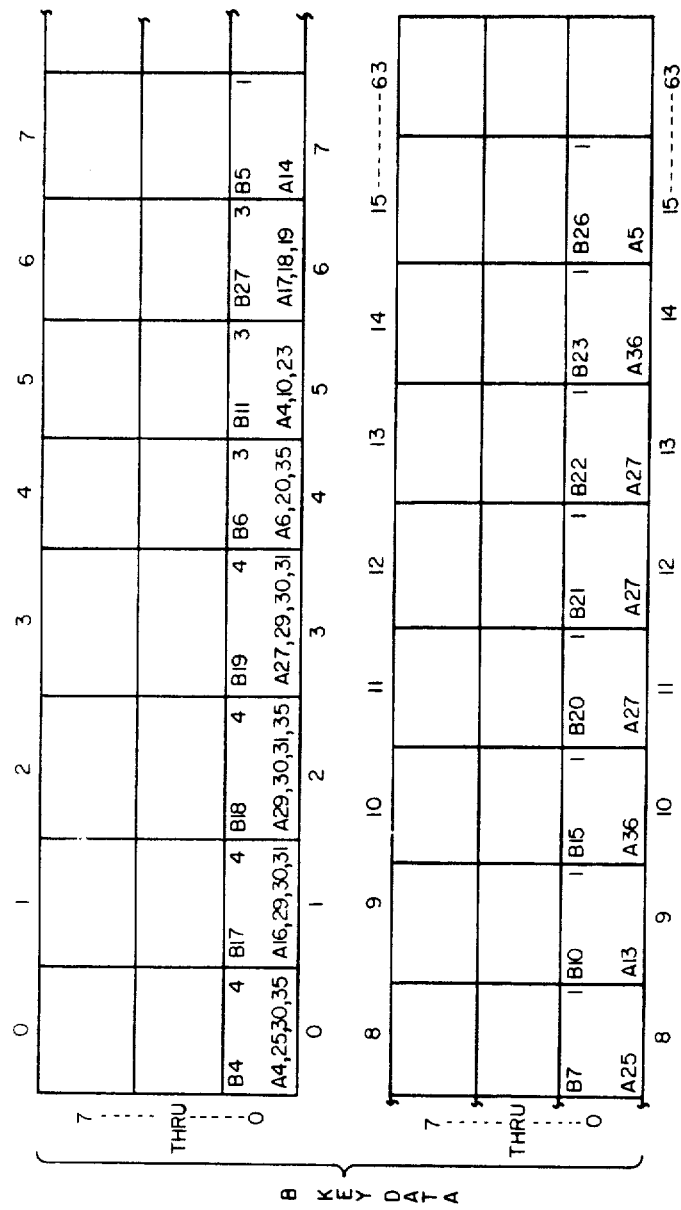
FIG. 8 is a two dimension B Key Data and B Translation Data map for the example in accordance with the invention.

The manner in which data states are assigned to the word address locations of the PROMs for the embodiment of the invention shown in FIG. 2 may be better understood with reference to FIGS. 7-9. FIG. 7 illustrates the conceptualization of the separation of the incoming addresses into a first dimension A group and a second dimension B group. The result is a plane with the A group addresses incrementing horizontally from left to right and with the B group addresses incrementing vertically from top to bottom. Each A group address line intersects each B group address line and similarly each B group address line intersects each A group address line. Each of these intersection points represents an input state or word location within main storage module 24. A portion of these word locations are assumed to be defective and have been marked with an *. For convenience of illustration, the defective word addresses have been concentrated in the upper lefthand corner of the AB plane. However, in general it would be expected that the defective address locations would be distributed randomly over the entire AB plane.

In order to facilitate the assignment of translation and key data states to input addresses to the A PROMs and B PROMs it is helpful to list the lines intersecting defective word locations as in Table I and Table II. In Table I each of the B lines which intersects a defective word location is listed in column Bi. Opposite each listed line, there is indicated in column n(Bi) (later called SB) the total number of defective word locations which are intersected by the line. In the next column, designated ABi, there is listed the A line intersections of each of the defective word locations intersected by the given B line. That is, B line B4 corresponding to binary encoded input address 000000100 for address lines AI10-AI18 respectively has an intersection with four defective word locations which occur at A lines A4, A25, A30 and A35. The last, or map order column, lists the B lines sequentially in order of the number of defective word locations which are intersected thereby with the B lines intersecting the most defective word locations being ordered first.

In Table II, column Ai lists the A dimension lines which intersect defective word locations with column n(Ai) (later referred to as SA) listing the number of defective word locations which are intersected by the corresponding lines in column Ai. Column BAi lists the intersections with the B dimension lines at which defective word locations occur. The map order column provides a sequential numerical listing of the A lines which intersect defective word locations in order of the number of defective word locations which are intersected with the greatest number being ordered first.

It is also helpful to utilize the arrays shown in FIG. 8 and FIG. 9 in assigning data states to the A and B PROMs. These figures divide the data contents of the PROMs into a translation data dimension along the horizontal axis and an orthogonal key data along the vertical axis. The B PROMs shown in FIG. 8 have a 64 by 8 configuration and are shown in two sections, one above the other, to better conform the array to the shape of the available drawing space. FIG. 9 illustrates the 64 by 16 array of data states for the A translation PROM 42 and A key PROM 40.

For the present example, data states will be assigned to the translation and key PROMs with an even or level packing for the B PROMs and a close packing for the A PROMs. That is, referring to FIG. 8, an attempt will be made to fill the 64 possible error locations associated with each of the 64 B translation states evenly so that all of the B translation states are filled by an approximately equal amount as B lines are assigned to the FIG. 8 B map. For example, line B4 is assigned to BK0, BT0 and intersects 4 fault locations at A lines A4, A25, A30 and A35. Four of the 64 available fault states are thus consumed by this assignment. Until all of the other B translation states BT1-BT63 have at least four fault states mapped thereto there will not be another first attempt to map a second B line to B translation state BT0. The PROM mapping program discussed infra would subtract the four assigned faults from the 64 maximum to indicate 60 available states. Additional B lines are then mapped to B translation states on the basis of the most available fault states. If a conflict prevents mapping to the B translation state with the most available fault states, the B translation state with the second most available fault states is tried and so forth.

Instead of even packing, a close or maximum packing approach is preferred for assigning A lines to the A map as shown in FIG. 9. An attempt is made to first fill all 64 fault states of A translation state AT0, then AT1, then AT2 and so forth. If a conflict prevents mapping of an A line to AT0, an attempt is made to map it to AT1, then AT2 and so forth. The most dense assignment of faults to A translation states thus occurs at the lower numbered states with the possibility of the higher numbered states having no faults assigned to them. The encoded A translation bits are then made the most significant address inputs to the target storage module 26 and to the fault PROM 48. If, for example, the top eight A translation states AT56-AT63 remain empty, then the last 512 words of fault PROM 48 will never be addressed and need not be implemented, thus reducing the cost of the translator 28, which is implemented with 512 word by 8 bit modules. In general the amount of fault PROM 48 that can be eliminated, if any, will depend upon the number of input address states that must be translated and the efficiency with which they can be assigned to the lower ordered A translation states without conflict. If the last 16 A translation states AT48-AT63 were to be left empty, then the last 1K words of fault PROM 48 could be left unimplemented. In addition to the possible reduction in fault PROM 48 costs it is believed that even packing of the B lines into the B map increases the number of A lines that can be assigned to the A map without conflict, the mapping of A lines without conflict being the most likely limit upon the maximum number of fault states that can be mapped.

Although the A and B dimension lines which intersect no defective word locations are not explicitly shown in the tables and drawings, these are also assigned states in the A and B arrays in accordance with the one to one and onto mapping. However, because there is no problem of avoiding multiple B lines associated with A lines and multiple A lines associated with B lines in the assignment of nondefective addresses (there being no assignment of a corresponding key state in fault PROM 48) there will never be any problem assigning A or B lines which do not intersect a defective word location to its respective A or B array data state. These lines may simply be assigned last (they intersect 0 word locations) to any data state which is available after the assignment of address lines which do intersect defective word locations.

The A and B address lines which do not intersect defective word locations actually represent a don't care situation and alternatively all such A addresses could be assigned to a single data state within the A array and all such B addresses could be assigned to a single data state within the B array. It is simply necessary to assure, that in programming the fault PROM 48, that the corresponding word location therein is programmed to assure that comparator 56 does not produce a match so that no address translation occurs for these A and B lines which do not intersect a defective address location.

In the present example, after all of the B address lines have been assigned to the B array in FIG. 8, the A address lines will then be assigned to the A array in FIG. 9. While the above process is conceptualized as assigning A lines to the AK×AT A map and B lines to the BK×BT map, it should be remembered that actually the A lines are input address states or word locations for the A PROMs 40, 42 and the AK and AT states are the data assigned to the corresponding word locations in encoded form. Similarly, the B lines represent input address states or word locations for the B PROMs 44, 46 and the BK and BT states represent the data stored in the corresponding word locations in encoded form.

Referring now to Table I, the map order column indicates that B dimension line B4 is the first to be assigned. This being the first entry, there is no possible conflict and line B4 is assigned to data state 00. That is, B key data BK equals 0 and B translation data BT equals 0. Line B4 intersects four defective word address locations corresponding to A lines A4, A25, A30, and A35. This data along with the total number of errors is indicated in the array space provided in FIG. 8 for the B array at location 0,0.

The second entry in Table I in map order is B line B17 which intersects four defective word locations at A lines A16, A29, A30 and A31. B line B17 is readily assigned data state 0,1 in the array shown in FIG. 8 and the associated total number of defective word locations and corresponding A line intersections are indicated therein. Since this is the first entry into BT1 there are no possible conflicts from the assignment of the same associated A line to BT1 twice.

Line B18 has associated therewith four defective word locations at intersections with lines A29, A30, A31, and A35. In accordance with the preestablished pattern of evenly filling the 64 fault states for each B translation state, line B18 is entered at B map location 0,2. The four defective word locations and corresponding A line intersections are indicated in the available space. Again, the first entry into a given translation state poses no conflicts unless the number of associated faults for a B line exceeds 64.

Table I indicates that the next B line to be assigned is line B19. Line B19 has associated therewith four defective word locations at the intersection with lines A27, A29, A30 and A31. Line B19 can be assigned data state 0,3 in the B array shown in FIG. 8. In a similar manner all of the B lines listed in Table II can be assigned a data state in the B array shown in FIG. 8 with care being taken that the B line is not assigned to a BT column such that the A lines associated therewith are also associated with a B line previously assigned to the same column.

In the present example there have not been a sufficient number of errors to provide entries in all of the BT columns. However, in an actual memory it would be expected that most of the 512 B lines would have at least one fault associated therewith. After the first 64 B lines have been located on the B map it will be necessary to map the 65th B line into a BT column already occupied by a B line. The BT column having the fewest number of fault states assigned thereto is selected first and will quite likely be column BT63. Deviating from the present example to illustrate the point, assume that BT63 has assigned thereto line B14 with four fault intersections at A10, A75, A76 and A200. Column BT62 might have line B510 assigned thereto with five fault intersections at A10, A35, A501, A729 and A1023. All other BT columns would have a B line mapped thereto with five or more associated faults.

The next or 65th B line to be mapped might be line B485 with four fault intersections at A25, A75, A501, and A842. Column BT63 would receive the first mapping attempt since it has the fewest number of fault states mapped thereto. However, fault A75 associated with line B485 conflicts with fault A75 associated with previously mapped line B14. The next least occupied BT column is then selected, which might be column 62. However, fault A501 associated with line B510 conflict with fault A501 associated with line B485 so column B62 cannot be used. Additional columns, such as BT61, are attempted until line B485 can be mapped without a conflict from the associated faults. A conflict would be equivalent to assigning the same translated address to two different input addresses identifying defective storage locations.

After completion of the B map, the A lines are assigned to the A map as shown in FIG. 9. The process is essentially the same except that each A line is assigned to an AT state with as low a number as possible of available fault vacancies instead of evenly to the AT state with the most available fault vacancies out of 64 possible.

Referring to Table II, line A27 is the first to be assigned with four faults at B19, B20, B21 and B22. It is assigned without conflict to location 0,0. Next is line A30 having four faults at B4, B17, B18 and B19. Fault B19 conflicts with fault B19 of line A27, forcing assignment to location 0,1. The third line to be assigned is A35 with three fault intersections at lines B4, B6 and B18. Line A35 can be assigned to location 1,0, the first location attempted. Next, A29 is assigned to location 0,2 and the process continues with each line being assigned to the lowest number nonconflicting AT state until all A lines have been assigned to the A map as shown.

After all of the A lines associated with faults have been mapped, the remaining lines, such as A0 can be mapped to the remaining available AK, AT states.

The arrays shown in FIGS. 8 and 9 now define the data which must be entered into the A and B PROMs. Referring to FIG. 8, it will be seen that address B4 is assigned data state 0,0 (modulo 64). Address word 4 within B translation PROM 44 is thus loaded with 0 (modulo 64) and address word 4 within the B key PROM 46 is loaded with data state 0 (modulo 8) also. Continuing with the B array it can be seen that address word 17 of B translation PROM 44 is loaded with data state 1 (modulo 64) while address word location 17 within B key PROM 46 is loaded with data state 0. Similarly, it will be seen that address locations 18, 19, 6, 3, 27 and 5 within B translation PROM 44 are loaded with data states 2, 3, 4, 5, 6 and 7 (modulo 64) respectively. Data state 0 is loaded into the B key PROM 46 for all of these address locations. Similarly, the A array shown in FIG. 9 shows the data states for the A translation PROM along the horizontal axis and the data states for the A key PROM 40 along the vertical axis with the corresponding A input addresses being indicated at the intersection areas. That is, data state 0,0 is loaded into the A key PROM 40 and A translation PROM 42 at address location 27. At A input address 30 data state 1 (modulo 64) is loaded into the A translation PROM 42 and data state 0 is loaded into the A key PROM 40. In a similar manner, the proper data state is loaded into the address word locations in the A PROMs 40, 42 for each input address.

The data contents of fault PROM 48 can be derived from the A and B arrays shown in FIG. 9 and FIG. 8. For example, fault PROM address 0,0 corresponds to A array column AT0 and B array column BT0. This corresponds to defective error location A35, B4. In the A array, address A35 corresponds to A key data 1 so that 1 (modulo 16) must be loaded into the first four bit positions of fault PROM address 0,0. Similarly, in the B array, line B4 corresponds to BK=0 so that 0 (modulo 8) must be loaded into the next three data bit positions of address 0,0. Finally, a 1 is loaded into the eighth bit position to indicate that this address corresponds to a defective word location which requires translation into the target storage module 26. For PROMs having an unburned state of all 1's, a 0 would probably be used to indicate a valid translation state.

Similarly, fault PROM address 0,1 corresponds to A array column AT0 and B array column BT1. Defective address location A16, B17 is common to these columns. Address A16 is assigned A key data state AK1 so that 0001 must be loaded into the first four bits of fault PROM address location 0,1 (modulo 64). Address line B17 corresponds to B key data state BK0 so that 000 is loaded into the next three bits of word location 0,1 (modulo 64) in fault PROM 48. The eighth bit of this word location is loaded with a 1 to indicate that it represents a defective address location requiring translation into target storage module 26. In similar manner, each defective word location corresponds to a unique combination of an A array column AT and a B array column BT. This combination defines an address in the fault PROM 48 with the data at that address being loaded with the corresponding four bits of A key data, three bits of B key data and a 1 to indicate the correspondence to an address for a defective word location which requires translation into the target storage module 26. Not all of the available 4K locations in fault PROM 48 are utilized and the unused locations such as address 0,8 (modulo 64) are loaded with a 0 in bit number 8 to indicate that an address translation is not to be made and to inhibit a fault output from comparator 56. Table III illustrates the data contents of the fault PROM 48 for each of the active addresses in the present example. The column labeled defective address indicates the intersection of the A line and B line to which the defective word location for the address being translated corresponds.

In operation of the address translator 28, assume that address 0000000100 000000100 corresponding to two dimensional address A4, B4 is received by data store 20 from controller 16 along with an appropriate read or write command. This causes address location 4 within A key PROM 40 and A translation PROM 42 to be accessed. These PROMs store 0001 and 000010 respectively at these locations. Similarly, this input address causes location 4 within B key PROM 46 and B translation PROM 44 to be addressed. These locations also store 000 and 000000 respectively. As a result, A translation PROM 42 presents the six bits 000010 to fault PROM 48 and to the A input of multiplexer 50. Similarly, B translation PROM 44 presents the six bits 000000 to fault PROM 48 and also to the A input of multiplexer 52. At the same time, A key PROM 40 presents the four bits 0001 to comparator 56 while B key PROM 46 presents the three bits 000 to comparator 56. The twelve bits of data provided to the address input of fault PROM 48 cause address location 2,0 (modulo 64) to be addressed and, as shown in Table III, fault PROM 48 responds by presenting the eight bits 10001 000 to comparator 56. These eight bits of data match the other eight bits of data received by comparator 56 causing comparator 56 to generate a logic 1 fault signal at its output. This signal is inverted by NAND gate 60 to a logic 0 level to cause multiplexers 50 and 52 to select their A inputs for output as translated memory address signals A0-A5 and A6-A11 respectively. The logic 0 output of NAND gate 60 is further inverted by NAND gate 62 to generate the twentieth memory address signal A19 at a logic 1 level to cause the data storage module to select the target storage module portion 26 thereof. The input address A4, B4 is thus translated to translated memory address location 2,0 (modulo 64) within the target storage module 26 which then proceeds to read or write data at that address location therein in a manner which is transparent to the controller 16 except for a slight time delay of approximately ¼ microsecond which is required to accomplish the address translation.

DATA ASSIGNMENT PROGRAM

The data assignment program must operate to assign the A input line states to the A map (FIG. 9) and the B input line states to the B map (FIG. 8). Once these assignments are made the data content of the A, B, and fault PROM are inherently defined and the lists required for programming or "blowing" these PROMs are readily derived. The assignment of A and B input states to the A and B map must be consistent with the following rules:

1. No more than 64 (NBT) errors (mapped element) can be associated with each A input code. This is because a single A input code must be assigned to a single AT column in the A map and multiple errors associated therewith must be distinguished by assignment of the corresponding B input line states to different BT columns in the BT map. There are 64 BT columns in the B map in the present arrangement.
2. No more than 64 (NAT) errors (mapped element) can be associated with each B code. This is simply the converse of No. 1 above.
3. The assignment of an A input line state having a fault or mapped element associated therewith to the A map must be a one-to-one mapping.
4. The assignment of an input B line state having a fault or mapped element associated therewith to the B map must be a one-to-one mapping.
5. The A input line and B input line assignments to the A and B map must be in such a way that no more than one fault or mapped element is associated with each combination of a BT column and an AT column.

A statistical study has indicated that these restrictions limit the actual number of states that can be translated to something less than the actual hardware capacity (4096 in the present example). An algorithm that will map approximately 3500 elements out of a maximum capacity of 4096 with a probability in excess of 99%, is illustrated by the program flow chart shown in FIG. 10. A listing of a corresponding program in the BASIC programming language is set forth in Table V hereafter. Table IV provides a definition of important terms used in the algorithm flow chart while Table VI provides a correlation between the terms defined in Table IV and the terms used in the program set forth in Table V. Limitations on the use of variable names inherent in the basic program language necessitated a substitution of terms in many instances.

Figure 10:
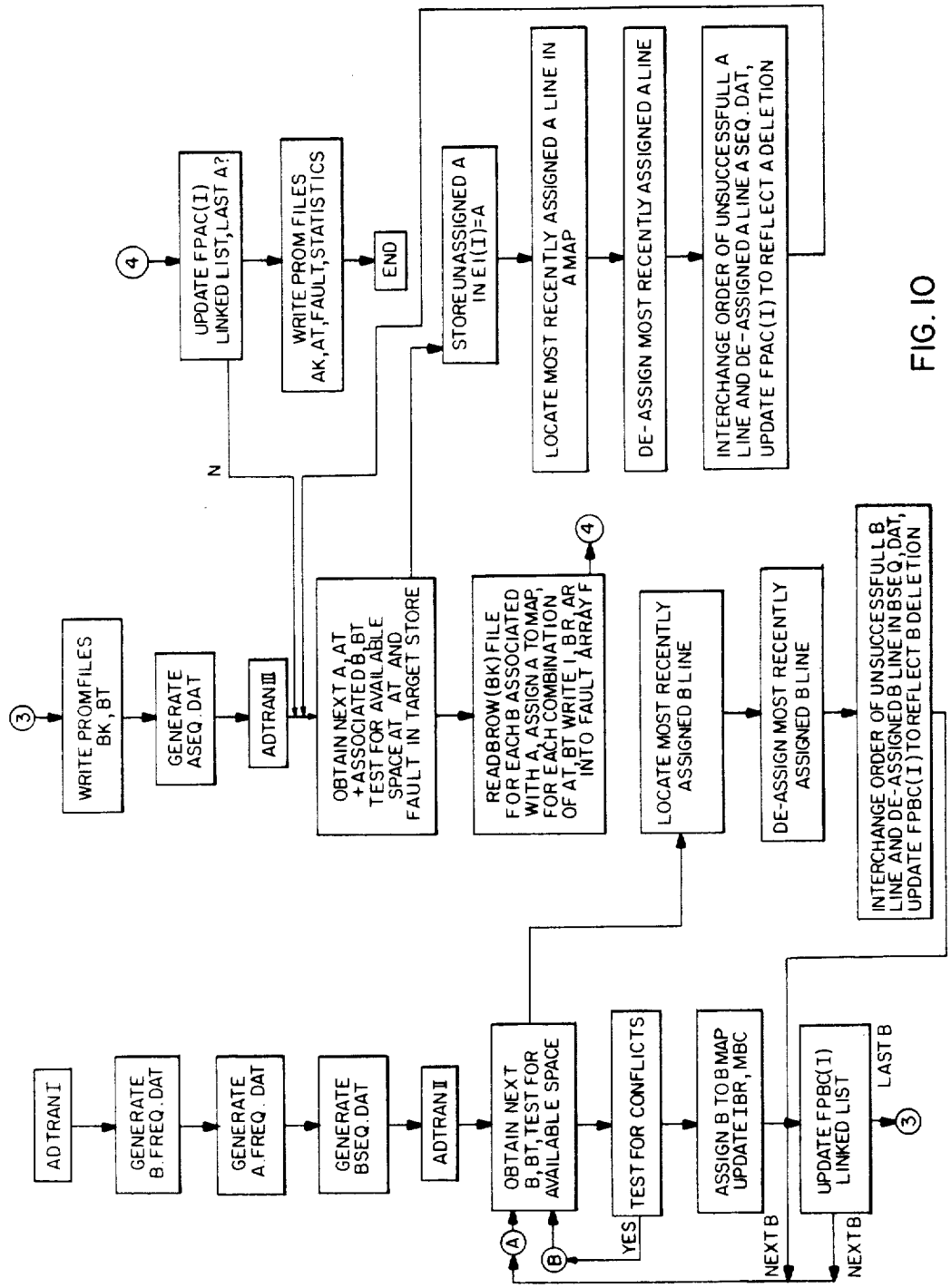
FIG. 10 is a flow chart illustrating an algorithm for assigning data states to data stores in the mapping system shown in FIG. 2.

The algorithm shown in FIG. 10 first assigns the B input codes to the B map in the order of the most to least fault states or mapped elements which are associated with each B code. The algorithm then assigns the A input codes to the A map in the order of most to least fault states or mapped elements associated with each A input code. Because there are half as many B input lines as A input lines, there are twice as many fault states per line and the probability of a successful mapping of a large number of errors is therefore diminished. Mapping of the B lines first eliminates restrictions that might otherwise be imposed by the prior mapping of A lines and thereby increases the probability of successfully mapping a given number of B lines. The B lines are mapped with an even packing in which a next B line is preferentially assigned to a BT column state in the B map having the most available fault states, there being 64 total. The BT columns are listed in sequential order by number of available fault states and if a conflict prevents a mapping to the BT column with the most fault states, the next and then subsequent BT columns are attempted and until a successful mapping is achieved or all BT columns have been exhausted.

After the B input lines are mapped, the A input lines are mapped with a close packing. A input lines are also mapped in order of most associated mapped states to least. The A input lines are mapped with a close packing order in which an attempt is made to first fill the AT0 state, then the AT1 state, then the AT2 state and so forth. This close packing is believed to optimize the probability of successfully assigning all of the A lines to the A map where a large number of mapped states are involved. Close packing further has the advantage of potentially leaving the high numbered AT states with no mapped element or fault assignments empty in the event that less than the full capacity of mapped states are being mapped. It may then be possible to reduce the cost of the translator 28 by not having to physically implement the high order address locations of fault PROM 48.

A total of 2300 mapped elements can be accommodated relatively easily and the program has a provision to reduce running time by simply treating the AT elements in sequential order from AT0 to AT63 if the total number of errors to be mapped is less than 2300. However, if the total number of errors exceeds 2300 the sequential order of the AT elements is initialized at AT0 to AT63 and modified to reflect faults in target store 26, but is updated after each A line entry to maintain the sequential order from the greatest number of fault states or mapped elements to the least number of available fault states or mapped elements. The first alternative is in effect an approximation of the second, preferred alternative, which reduces program running time.

In the event that the program is unable to assign a given B line to the B map or a given A line to the A map because of a conflict, the preceding input line is deleted from the map assignment and interchanged in sequential order with the unassigned input line. If the unassigned input line is still unassignable, the next preceding input line is deassigned from its corresponding map and interchanged in the sequential order of assignments with the unassigned input line. This process continues until the unassigned input line is assigned without conflict. The normal assignment process then resumes with the input lines which had been deassigned being reassigned to the corresponding map.

The number of each unsuccessfully assigned line is stored in an array E1(I) to preclude an endless loop where each of two lines may be assigned only after the other has been deassigned.

Referring now to FIG. 10, it will be seen that the data assignment program is divided into three main parts designated ADTRAN I, II and III. The use of three parts is not related to the algorithm, but merely accommodates restrictions imposed by the particular computer from which the program has been run. The three parts are simply chained together to provide one total program.

The program begins by accessing the input file designated ADDR.U. which contains the list of defective addresses or mapped elements which must be mapped from the input set of addresses to the output set of addresses. This list is utilized to generate a first file for the B group of input addresses, designated B.FREQ.DAT and a second file for the A group input addresses designated A.FREQ.DAT. These files have the general form of the first three columns of Table I and Table II and for each record list the input line number (whether or not there is a defective address location associated with the line) the number of defective address locations or mapped elements associated with the line, and the A input line intersection with the given B input line at each defective address location.

The program next generates the working file BSEQ.DAT which is derived from the B.FREQ.DAT file and lists the input address lines in sequential order from the greatest number of associated defective addresses to the least number of associated defective addresses. That is, a line intersecting 4 defective address locations such as line B4 in FIG. 7 would be listed ahead of a line intersecting 3 defective address locations such as line B6. This completes the first portion of the program designated ADTRAN I.

The program then chains to ADTRAN II which proceeds to assign the B group of input addresses to the B map, a table TB(I,J) storing data similar to FIG. 8. The program obtained the next input B line from the BSEQ.DAT information and obtains the next BT state from a linked list FPBC(I) which maintains the BT states in order of most available vacancies for receiving mapped elements or faults. After checking to be sure that the number of defective address locations associated with the current B line does not exceed the maximum number which can be mapped (64), the program tests for conflicts with previous assignments. That is, the current B line cannot be mapped to the current BT state if a fault location associated with the current B line corresponds to a fault location associated with a B line which has been previously mapped to the same BT state. If a conflict exists, the program returns to point B where a next BT state is obtained from the FPBC(I) linked list and this BT state is tested for conflicts.

When a BT state with no conflicts is found, the current B input line is assigned to that BT state at a KB key state indicated by a variable IBR(J) which indicates the next available BK row in the B map for each BT column, J. After the assignment to the B map the IBR(J) variable is updated by incrementing the element corresponding to the BT column to which the B input line was assigned. A second variable, MBC(J) stores the number of available vacancies for receiving faults or mapped states associated with each BT column. This variable is initialized at 64 and upon entering a B line to the B map, is updated by subtracting the number of fault locations associated with the assigned B line from the element of MBC corresponding to the BT column to which the B line have been mapped. The FPBC(I) linked list is then updated to maintain the BT columns in order of most available vacancies for receiving faults (MBC) to least available vacancies for receiving faults and the program returns to point A where a next B is obtained and tested for conflicts.

In the event that the program is unsuccessful in assigning a given B input line to any of the 64 BT columns, the program branches to locate the most recently assigned B line in the B map, TB(I,J). After this most recently assigned B line is located, it is deassigned with the associated variables such as IBR and MBC being updated to reflect the deassignment and the deassigned line is interchanged in order with the unsuccessfully assigned B line in the BSEQ.DAT file. The program then returns to point A to start over in its attempt to assign the unsuccessful B line with the sequential order of the unassigned B line moved up by one. Upon completing the assignment of all B lines to the B map, the program proceeds to point 3 where PROM files BK(I) and BT(J) are written. The BK file merely provides a sequential list of key row assignments in the B map, TB(I,J), in order or the B input line number. The BT file provides a sequential listing of the BT column assignments associated with each B input line in the order of the B input line number. The second part of the program then terminates with the generation of an ASEQ.DAT file from the A.FREQ.DAT file information.

Part III begins by obtaining the next A input row, the next AT column in the A map, and the associated B and BT column for each fault associated with the current A input line. This information is utilized to access input data files to determine if the AT column has an available BK row state and a sufficient number of unassigned vacancies for receiving fault states, MAC(J), to receive the A line entry and whether the A line entry would result in translation to an address within target storage module 26 which is defective. If the address is defective the next AT column is selected. A test is also made for conflicts between the B lines associated with the current A line and those associated with A lines previously assigned to the proposed AT column. If there are no test failures, the B row file (BK) is read for each B line which intersects the A line at a fault location, the A line is assigned to the A map, and for each combination of AT, BT corresponding to an error on the A input line, the terms 1, BR, and AR are written into the fault array F. The one indicates that the associated address corresponds to a mapped element or fault state and is to be translated, B row is the BK row state to which the B line is assigned and AR is the AK row state to which the A line is assigned. The F array thus defines the content of fault PROM 48.

The program then continues to point 4 where the FPAC(I) linked list is updated to reflect the most recent A line assignment and a test is made for the assignment of all A lines. If no, the program continues to the beginning of ADTRAN III to assign the next A line. If the last A line has been assigned, the program continues to write PROM files AK, AT, Fault, and Statistics. The AK and AT files correspond to the BK and BT files to define the content of the A key PROM 40 and A translation PROM 42. The fault file corresponds to the content of the fault array and defines the data for fault PROM 48. The statistics file merely stores data relating to the execution of the program and is not a material part of the data assignment algorithm.

In the event that a conflict precludes the assignment of an A line to one of the 64 AT column locations in the A map, the program branches to deassign the most recently assigned A line and interchange it in sequential order with the unsuccessfully assigned A line. This procedure is essentially the same as that for an unsuccessfully assigned B line.

The above described arrangements operate by translating the address for a complete 18 bit word any time a defect occurs within any one or more of the bits of the word within the main storage module 24. This results in some inefficiency in that 18 bits must be reassigned or translated when even one of 18 bits of the original word location is defective. It would of course be possible to subdivide each addressed word into groups of one or more bits with additional address lines or bits being assigned to select only one of these groups for address translation to avoid having to provide 18 spare bits to accommodate a single defective bit. However, in the present example of a core memory it has been found practical and cost effective to translate a complete word of stored data any time a single bit within the word is found to be defective. This is particularly true in the case of a core memory where data is accessed on a word at a time basis and the separation of data for a single output word into two internal words would require two memory cycles to generate the single output word. This would significantly slow effective memory cycle time. It should be further appreciated that even though a ¼ microsecond delay is associated with the address translator 28, where a plurality of memory cycles are to occur in succession, the delay for a next memory cycle can overlap the cycle time for a preceding memory cycle. When properly arranged, the ¼ microsecond delay thus affects only access time and not the data transfer rate.

While there have been shown and described above various arrangements of systems for selectively mapping a subset of a first set into a second set in the form of memory address translators, it will be appreciated that the invention is not specifically limited thereto. Accordingly, all variations, modifications, and equivalent arrangements within the scope of the accompanying claims should be considered to be within the scope of the invention.

TABLE I

| B DIMENSION TABLE | | | |
|---|---|---|---|
| Bi | n(Bi) or SB | ABi | Map Order |
| B4 | 4 | A4, A25, A30, A35 | 1 |
| B5 | 1 | A14 | 8 |
| B6 | 3 | A6, A20, A35 | 5 |
| B7 | 1 | A25 | 9 |
| B10 | 1 | A13 | 10 |
| B11 | 3 | A4, A10, A23 | 6 |
| B15 | 1 | A36 | 11 |
| B17 | 4 | A16, A29, A30, A31 | 2 |
| B18 | 4 | A29, A30, A31, A35 | 3 |
| B19 | 4 | A27, A29, A30, A31 | 4 |
| B20 | 1 | A27 | 12 |
| B21 | 1 | A27 | 13 |
| B22 | 1 | A27 | 14 |
| B23 | 1 | A36 | 15 |
| B26 | 1 | A5 | 16 |
| B27 | 3 | A17, A18, A19 | 7 |
| B0 | 0 |  | 17 |

TABLE II

| A DIMENSION TABLE | | | |
|---|---|---|---|
| Ai | n(Ai) or SA | BAi | Map Order |
| A4 | 2 | B4, B11 | 6 |
| A5 | 1 | B26 | 9 |
| A6 | 1 | B6 | 10 |
| A10 | 1 | B11 | 11 |
| A13 | 1 | B10 | 12 |
| A14 | 1 | B5 | 13 |
| A16 | 1 | B17 | 14 |
| A17 | 1 | B27 | 15 |
| A18 | 1 | B27 | 16 |
| A19 | 1 | B27 | 17 |
| A20 | 1 | B6 | 18 |
| A23 | 1 | B11 | 19 |
| A25 | 2 | B4, B7 | 7 |
| A27 | 4 | B19, B20, B21, B22 | 1 |
| A30 | 4 | B4, B17, B18, B19 | 2 |
| A35 | 3 | B4, B6, B18 | 3 |
| A36 | 2 | B15, B23 | 8 |
| A29 | 3 | B17, B18, B19 | 4 |
| A31 | 3 | B17, B18, B19 | 5 |
| A0 | 0 |  | 20 |

TABLE III

| FAULT PROM | | |
|---|---|---|
| Address (Mod 64) | Defective Address | Binary Data |
| 0,0 | A35, B4 | 1 000 0001 |
| 0,1 | A16, B17 | 0 000 0111 |
| 0,2 | A35, B18 | 1 000 0001 |
| 0,3 | A27, B19 | 1 000 0000 |
| 0,4 | A35, B6 | 1 000 0001 |

TABLE III-continued

FAULT PROM

| Address (Mod 64) | Defective Address | Binary Data |
|---|---|---|
| 0.5 | A10, B11 | 1 000 0100 |
| 0.6 | A17, B27 | 1 000 1000 |
| 0.7 | A14, B5 | 1 000 0110 |
| 0.8 | | 0 |
| 0.9 | A13, B10 | 1 000 0101 |
| 0.10 | A36, B15 | 1 000 0010 |
| 0.11 | A27, B20 | 1 000 0000 |
| 0.12 | A27, B21 | 1 000 0000 |
| 0.13 | A27, B22 | 1 000 0000 |
| 0.14 | A36, B23 | 1 000 0010 |
| 0.15 | A5, B26 | 1 000 0011 |
| 0.16 | | 0 |
| ... | | |
| 0.63 | | 0 |
| 1.0 | A30, B4 | 1 000 0000 |
| 1.1 | A30, B17 | 1 000 0000 |
| 1.2 | A30, B18 | 1 000 0000 |
| 1.3 | A30, B19 | 1 000 0000 |
| 1.4 | A6, B6 | 1 000 0001 |
| 1.5 | A23, B11 | 1 000 0011 |
| 1.6 | A185, B27 | 1 000 0010 |
| 1.7 | | 0 |
| 1.8 | | 0 |
| 1.9 | | 0 |
| 1.10 | | 0 |
| ... | | |
| 1.63 | | 0 |
| 2.0 | A4, B4 | 1 000 0001 |
| 2.1 | A29, B17 | 1 000 0000 |
| 2.2 | A29, B18 | 1 000 0000 |
| 2.3 | A29, B19 | 1 000 0000 |
| 2.4 | A20, B6 | 1 000 0011 |
| 2.5 | A4, B11 | 1 000 0001 |
| 2.6 | A19, B27 | 1 000 0010 |
| 2.7 | | 0 |
| ... | | ... |
| 2.63 | | 0 |
| 3.0 | A25, B4 | 1 000 0001 |
| 3.1 | A31, B17 | 1 000 0000 |
| 3.2 | A31, B18 | 1 000 0000 |
| 3.3 | A31, B19 | 1 000 0000 |
| 3.4 | | 0 |
| 3.5 | | 0 |
| 3.6 | | 0 |
| 3.7 | | 0 |
| 3.8 | A25, B7 | 1 000 0001 |
| 3.9 | | 0 |
| ... | | |
| 3.63 | | 1 |
| ... | | |
| 63.63 | | 1 |

TABLE IV

PROGRAM DEFINITIONS

| | |
|---|---|
| A. FREQ. DAT | A file having stored at each record an A line no. corresponding thereto, the total number of fault locations on the A line, SA, and all of the B line intersections at fault locations, BA(J). |
| B. FREQ. DAT | A file having stored at each record a B line no. corresponding thereto, the total number of fault locations on the B line, SB, and all of the A line intersections at fault locations, AB(J). |
| ASEQ DAT | A listing of all A lines in the order of most faults to least faults. |
| BSEQ DAT | A listing of all B lines in the order of most faults to least faults. |
| FPAC(I) | A linked list of AT columns (AC) in order of least available fault states to most available fault states. Address 64 (NAC) points to the head of the list, with a sequential pointing to the tail which points to address 64. Initialized with AT0 at the head and AT63 at the tail. |
| IPAC | A current pointer to FPAC(I). |
| PPAC | Most recent past pointer to FPAC(I). |
| FPBC(J) | A linked list of BT columns (BC) in order of most available fault states to least available fault states. Address 64 (NBC) points to the head of the list, with a sequential pointing to the tail, which points to address 64. Initialized with BT0 at the head and BT63 at the tail. |
| IPBC | A current pointer to FPBC(J). |
| PPBC | Most recent past pointer to FPBC(J). |
| IAR(J) | Next available assignable AK key state for a given AT column. Initialized at 0 for each of 64 AT columns. |
| IBR(J) | Next available assignable BK key state for a given BT column. Initialized at 0 for each of 64 BT columns. |
| MAC(J) | Number of available unassigned vacancies for receiving fault states for a given AT column. Initialized at 64 for each of 64 AT columns. |
| MBC(J) | Number of available unassigned vacancies for receiving fault states for a given BT column. Initialized at 64 for each of 64 AT columns. |
| A ROW FILE | A file that is addressable by an A line number and contains the assigned AK row location in the A map (FIG. 9) for each A line number. Stores the data to be "burned" into A key PROM 40. |
| A COL FILE | A file that is addressable by an A line number and contains the assigned AT column location in the A map (FIG. 9) for each A line number. Stores the data to be "burned" into A translation PROM 42. |
| B ROW FILE | A file that is addressable by a B line number and contains the assigned BK row locations in the B map (FIG. 8) for each B line number. Stores the data to be "burned" into B key PROM 46. |
| B COL FILE | A file that is addressable by a B line number and contains the assigned BT column locations in the B map (FIG. 8) for each B line number. Stores the data to be "burned" into B translation PROM 44. |
| TA(I,J) | A two dimensional table corresponding to FIG. 9 and storing the assigned A line numbers at assigned address location AK, AT. Initialized at −1 to indicate empty spaces. |
| TB(I,J) | A two dimensional table corresponding to FIG. 8 and storing the assigned B line numbers at assigned address location BK,BT. Initialized at −1 to indicate empty spaces. |
| F(BC,AC) | A fault detect array having addresses corresponding to the address locations in fault PROM 48 and target storage module 26. Initially stores the indications of defective word locations in target storage module 26 and set to zero at each address corresponding to a defect. Initialized at −1 otherwise. By end of program it stores at each BT,AT translation address a 1 indicating translation address, 3 BK key bits and 4 AK key bits. Other address locations are set to zero for PROMs having a manufactured state of all zeros. |
| FAULT DETECT FILE | A file storing the contents of F(BC,AC). |
| STAT. | A statistics file that is peripheral to the program algorithm and stores statistics of interest. |
| ADDR.U. | An error address file containing the input address number of all locations within storage module 23 which are defective. |
| NERR | Current No. of errors. |
| NA | No. of AI input address lines (1024). |
| NB | No. of BI input address lines (512). |
| NAT | No. of AT columns (64). |
| NBT | No. of BT columns (64). |
| NX | No. of defective address locations in target storage module 26. |
| LAC(J) | Maximum no. of default states that may be |

TABLE IV-continued

PROGRAM DEFINITIONS

| | |
|---|---|
| | assumed to a given AT column, AC(J). (64) |
| LBC(I) | Maximum no. of fault states that may be assigned to a given BT column, BC(I). (64) |
| MAC(J) | Current no. of unassigned fault states in AT column J. Initially LAC(J). |
| MBC(J) | Current no. of unassigned fault states in BT column J. Initially LBC(J). |
| IAR(J) | Next AK row state to be assigned in AT column J. Initially O. |
| IBR(J) | Next BK row state to be assigned in BT column J. Initially O. |
| NT | No. of addresses being translated. |
| NAR | No. of AK rows in A map (16). |
| NBR | No. of BK rows in B map (8). |
| SA(I) | No. of fault addresses on an input A line no. I. |
| SB(I) | No. of fault addresses on an input B line no. I. |
| QA(I) | A table listing the no. of errors SA on each input AI line no. I. |
| QB(I) | A table listing the no. of errors SB on each input BI line no. I. |
| ERR.IN2 DAT | An input file listing the defective address locations in target storage module 26. |
| IB | B input line number BI. |

TABLE V

```
5 REM -- ADDRESS TRANSLATION (PHASE 1)
10 REM -- PROGRAM TO GENERATE WORKING
   FILES
20 LET Z1 = SPC (2)
30 LET Z2 = SPC (3)
50 DIM 1%,T1[63],Q[511],A1[63]
60 READ N1,N2,N4,N5
100 OPEN #1, "1/ADDR.U"
100 OPEN #2, "1/B.FREQ.DAT"
112 OPEN #3, "1/ERR.IN2.DAT"
120 IF ERR 0 GOTO 290
130 LET I=0
140 READ #1;B,A
150 LET S=0
160 IF B≠I GOTO 210
165 IF S>=N4 GOTO 8000
170 LET A1[S]=A
180 LET S=S+1
190 READ #1;B,A
200 GOTO 160
210 IF S>N4 GOTO 8000
220 WRITE #2,I,0;I,S
230 MAT WRITE #2,-2,4;A1
240 LET I=I+1
250 IF I<N2 GOTO 150
265 LET H=(B-N2)*1024+A
270 LET C2 = INT (H/N4)
275 LET C1=H-(C2*N4)
280 WRITE #3;C2,C1
282 READ #1;B,A
285 GOTO 265
290 IF SPC (8)≠52 GOTO 9000
292 IF ERR 0 GOTO 9000
295 IF SPC (10)=282 GOTO 370
300 IF S>N4 GOTO 8000
310 WRITE #2,I,0;I,S
320 MAT WRITE #2,-2,4;A1
330 LET S=0
340 FOR J=I+1 TO N2-1
350 WRITE #2,J,0;J,S
360 NEXT J
370 CLOSE #1,#2,#3
380 PRINT "*** B FREQ TABLE COMPLETED ***"
390 REM -- GENERATE A FREQ TABLE
400 OPEN #1,"1/ADDR.U"
410 OPEN #3,"1/A.FREQ.DAT"
430 LET T=0
432 FOR I=0 TO N5-1
434 LET T1[I]=0
436 NEXT I
440 FOR I=0 TO N1-1
450 WRITE #3,I;I,T
```

TABLE V-continued

```
460 MAT WRITE #3,-2,4;T1
470 NEXT I
490 IF ERR 0 GOTO 600
500 READ #1;B,A
505 IF B>=N2 GOTO 500
510 READ #3,A,2;S
511 IF S>=N5 GOTO 8000
512 MAT READ ##3,-2,4;T1
514 LET T1[S]=B
516 LET S=S+1
520 WRITE #3,-2,2;S
530 MAT WRITE #3,-2,4;T1
540 GOTO 500
600 IF SPC (8)≠52 GOTO 9000
605 IF ERR 0
610 CLOSE #1,#3
612 PRINT "*A FREQ TABLE COMPLETED*"
1980 REM -- GENERATE B SORTED SEQUENCE
1985 OPEN #2,"1/B.FREQ.DAT!"
1990 OPEN #4,"1/BSEQ.DAT"
2000 FOR I=0 TO N2-1
2010 READ #2,I,2;Q[I]
2020 NEXT I
2030 LET R=N2-1
2040 LET E=0
2050 LET I=N2-1
2060 IF Q[I]≠E GOTO 2100
2070 WRITE #4,R,0;I
2080 LET R=R-1
2090 IF R<0 GOTO 220
2100 LET I=I-1
2110 IF I>=0 GOTO 2060
2120 LET E=E+1
2130 GOTO 2050
2200 CLOSE #2,#4
2210 LET C=1
2300 GOTO 9900
3000 1024,512,64,64
8000 PRINT "*TOO MANY ERRORS IN A SINGLE
     LINE*"
8010 GOTO 9900
9000 PRINT "*ERROR=";SPC (8)
9900 PRINT "* TIME ELAPSED (IN SEC) =";( SPC (2)-Z1)
     *3600+(( SPC (3)-Z2)/10)
9910 IF C=1 CHAIN "1/ADTRAN2"
9920 END
10 REM -- ADDRESS TRANSLATION (PHASE 2)
15 LET Z1 = SPC (2)
16 LET Z2 = SPC (3)
20 DIM 1%,M2[63],R2[63]
22 DIM Q[1023]
30 DIM T2[7,63],L2[63],P6[64],A1[63]
40 DIM A2[63],E1[63]
50 PRINT "*** ADDRESS TRANSLATION -- STAGE
     2 ***"
60 READ N1,N2,N3,N4,N5,N6
100 REM DECISION TABLE INITIALIZATION
110 OPEN #2,"1/ERR.IN2.DAT"
180 FOR J=0 TO N4-1
190 LET L2[J]=N3
200 FOR I=0 TO N6-1
210 LET T2[I,J]=-1
220 NEXT I
230 NEXT J
240 IF ERR 0 GOTO 350
300 READ #2;C2,C1
320 LET L2[C2]=L2[C2]-1
340 GOTO 300
350 IF SPC (8)≠52 GOTO 9100
360 IF ERR 0 GOTO 9100
370 CLOSE #2
380 PRINT "*** INITIALIZE LINKED LIST ***"
390 REM
400 FOR I=0 TO N4-1
410 LET M2[I]=L2[I]
420 NEXT I
500 REM -- SORT BC LINKED LIST IN DESENDING
     ORDER OF M2(I)
510 LET P5=N4
520 LET I1=N3
530 LET I=0
540 IF M2[I]≠I1 GOTO 580
```

TABLE V-continued

```
550  LET P6[P5]=I
560  LET P5=I
580  LET I=I+1
590  IF I<N4 GOTO 540
600  LET I1=I1-1
610  IF I1 >=0 GOTO 530
620  LET P6[P5]=N4
830  REM -- INITIALIZE ROW NOS.
840  FOR I=0 TO N4-1
850  LET R2[I]=0
860  NEXT I
910  PRINT "*** ROW/COLUMN ALLOCATION
     BEGINS ***"
1000 REM --- ROW , COLUMN ALLOCATION
1005 PRINT "B","BC","BR","N(BC)","SB"
1010 OPEN #3,"1/B.FREQ.DAT"
1030 OPEN #5,"1/BSEQ.DAT"
1035 FOR X=0 TO N2-1
1040 READ #5,X;B
1050 READ #3,B,2;S2
1060 REM --- ASSIGN B
1070 MAT READ #3,-2,4;A1
1100 LET P4=N4
1110 LET P5=P4
1120 LET P4=P6[P4]
1130 IF P4 >=N4 GOTO 7000
1190 IF M2[P4]<S2 GOTO 1110
1200 IF R2[P4] >=N6 GOTO 1110
1204 FOR I=0 TO N4-1
1208 LET E=T2[I,P4]
1210 IF E=-1 GOTO 1300
1212 READ #3,E,2;S3
1214 MAT READ #3,-2,4;A2
1216 FOR J1=0 TO S2-1
1232 FOR K1=0 TO S3-1
1234 IF A1[J1]=A2[K1]GOTO 1110
1236 NEXT K1
1280 NEXT J1
1290 NEXT I
1300 REM -- CONFIRM B ASSIGNMENT
1810 LET R4=R2[P4]
1820 LET T2[R4,P4]=B
1840 LET R2[P4]=R2[P4]+1
1850 LET M2[P4]=M2[P4]-S2
1852 PRINT B,P4,R4,M2[P4],S2
1860 LET P7=P4
1870 LET I=P6[P4]
1880 IF I=N4 GOTO 1920
1890 IF M2[P4] >=M2[I]GOTO 1920
1900 LET P7=I
1910 LET I=P6[I]
1915 GOTO 1880
1920 IF P7=P4 GOTO 2020
1922 LET P6[P5]=P6[P4]
1925 LET P6[P7]=P4
1930 LET P6[P4]=I
2020 NEXT X
2200 CLOSE #3,#5
2210 REM --- WRITE PROM FILES
2212 PRINT "*** WRITE PROM FILES ***"
2240 OPEN #1,"1/B.ROW"
2250 OPEN #2,"1/B.COL"
2330 FOR I=0 TO N6-1
2340 FOR J=0 TO N4-1
2350 WRITE #1,T2[I,J];I
2360 WRITE #2,T2[I,J];J
2370 NEXT J
2380 NEXT I
3000 CLOSE #1,#2
3990 REM -- GENERATE A SEQUENCE TABLE
4000 OPEN #7,"1/ASEQ.DAT"
4005 OPEN #4,"1/A.FREQ.DAT"
4010 FOR I=0 TO N1-1
4020 READ #4,I,2;Q[I]
4030 NEXT I
4040 LET R=N1-1
4050 LET E=0
4060 LET I=N1-1
4070 IF Q[I]≠E GOTO 4110
4080 WRITE #7,R;I
4090 LET R=R-1
4100 IF R<0 GOTO 4200
4110 LET I=I-1
4120 IF I >=0 GOTO 4070
4130 LET E=E+1
4140 GOTO 4060
4200 CLOSE #4,#7
4210 LET C=1
4300 GOTO 9900
7000 REM -- DEASSIGN PREVIOUS B
7001 IF S5=0 GOTO 7005
7002 FOR I=0 TO S5-1
7003 IF E1[I]=B GOTO 7008
7004 NEXT I
7005 IF S5=64 GOTO 8000
7006 LET E1[S5]=B
7007 LET S5=S5+1
7008 IF X=0 GOTO 8000
7010 LET X1=X-1
7020 READ #5,X1;D
7025 READ #3,D,2;S4
7027 PRINT "* ASSIGNMENT FAILED IN B=";B;
     DEASSIGN B=";D
7030 FOR I=N6-1 TO 0 STEP -1
7040 LET P4=N4
7042 LET P5=P4
7044 LET P4=P6[P4]
7046 IF P4=N4 GOTO 7070
7050 IF T2[I,P4]=D GOTO 7080
7060 GOTO 7042
7070 NEXT I
7080 LET T2[I,P4]=-1
7085 LET R2[P4]=R2[P4]-1
7090 LET M2[P4]=M2[P4]+S4
7100 REM -- RE-SORT BC LINKED LIST
7110 LET P7=N4
7120 LET I=P6[N4]
7130 IF I=P4 GOTO 7300
7140 IF M2[P4=M2[I]GOTO 7180
7150 LET P7=I
7160 LET I=P6[I]
7170 GOTO 7130
7180 LET P6[P5]=P6[P4]
7190 LET P6[P7]=P4
7200 LET P6[P4]=I
7300 REM -- INTERCHANGE ORDER IN "BSEQ.DAT"
7310 WRITE #5,X1;B
7320 WRITE #5,X;D
7330 LET X=X-1
7331 IF S5=0 GOTO 1040
7332 FOR I=0 TO S5-1
7334 IF E1[I]=D GOTO 7008
7335 NEXT I
7340 GOTO 1040
8000 PRINT "* B ASSIGNMENT FAILED !!"
8010 PRINT "M2(I)="
8020 FOR I=0 TO N4-1
8030 PRINT M1[I]
8040 NEXT I
8050 PRINT "T2(I,J)="
8060 FOR I=0 TO N6-1
8070 FOR J=0 TO N4-1
8080 PRINT T2[I,J];
     NEXT J
8090 NEXT I
8100 GOTO 9900
8200 REM -- ERROR HANDLING ROUTINE
9000 PRINT "* ERROR =";SPC (8)
9100 PRINT "IN LINE ";SPC (10)
9110 DATA 1024,512,64,64,16,8
9800 PRINT "* TIME ELAPSED =";( SPC (2)-Z1)*3600+
     ((SPC (3)-Z2)/10)
9910 IF C=1 CHAIN "1/ADTRAN3"
9920 END
10   REM -- ADDRESS TRANSLATION (PHASE 3)
15   LET Z1=SPC (2)
16   LET Z2=SPC (3)
20   DIM 1%,M1[63],R1[63],F1[63,63]
30   DIM T1[15,63],L1[63],P3[64],B1[63],D1[63]
40   DIM B2[63],E1[63]
50   PRINT "*** ADDRESS TRANSLATION -- STAGE
     3 ***"
60   READ N1,N2,N3,N4,N5,N6,N7
100  REM -- DECISION TABLE INITIALIZATION
```

TABLE V-continued

```
110  OPEN #2,"1/ERR.IN2.DAT"
120  FOR J=0 TO N3-1
130  LET L1[J]=N4
140  FOR I=0 TO N5-1
150  LET T1[I,J]=-1
160  NEXT I
170  NEXT J
240  IF ERR 0 GOTO 350
300  READ #2;C2,C1
310  LET F1[C2,C1]=-1
330  LET L1[C1]=L1[C1]-1
340  GOTO 300
350  IF SPC (8) 52 GOTO 9100
360  IF ERR 0 GOTO 9100
370  CLOSE #2
380  PRINT "*** INITIALIZE LINKED LIST ***"
430  FOR I=0 TO N3-1
440  LET M1[I]=L1[I]
450  NEXT I
500  OPEN #6,"1/STAT"
510  READ #6,0,29;E7
520  CLOSE #6
530  IF E7>=N7 GOTO 700 ! #ERRORS >=N7 ?
600  REM -- INITIALIZE UNSORTED AC LINKED LIST
610  LET P3[N3]=0
620  FOR I=0 TO N3-1
630  LET P3[I]=I+1
640  NEXT I
650  GOTO 830
700  RLM -- SORT AC LINKED LIST IN ASCENDING
     ORDER OF M1[I]
710  LET P2=N3
720  LET I1=N4
730  LET I=N3-1
740  IF M1[I]≠I1 GOTO 780
750  LET P3[I]=P2
755  LET P2=I
770  LET P3[N3]=I
780  LET I=I-1
790  IF I>=0 GOTO 740
800  LET I1=I1-1
810  IF I1>=0 GOTO 730
830  REM -- INITIALIZE ROW NOS
880  FOR I=0 TO N3-1
890  LET R1[I]=0
900  NEXT I
910  PRINT "***A ROW/COLUMN ALLOCATION
     BEGINS ***"
1000 REM -- A ASSIGNMENT
1005 PRINT "A","AC","AR","N(AC)","SA","BC"
1010 OPEN #1,"1/B.ROW"
1015 OPEN #2,"1/B.COL"
1020 OPEN #4,"1/A.FREQ.DAT"
1030 OPEN #5,"1/ASEQ.DAT"
1035 FOR X=0 TO N1-1
1040 READ #5,X;A
1050 READ #4,A,2;S1
1070 MAT READ #4,-2,4;B1
1100 LET P1=N3
1110 LET P2=P1
1120 LET P1=P3[P1]
1130 IF P1>=N3 GOTO 7000
1190 IF M1[P1]<S1 GOTO 1110
1200 IF R1[P1]>=N5 GOTO 1110
1300 REM -- CHECK FOR CONFLICT
1310 FOR J=0 TO S1-1
1320 READ #2,B1[J];B2[J]
1400 LET P4=B2[J]
1450 IF F1[P4,P1]≠0 GOTO 1110
1470 NEXT J
1490 REM -- CONFIRM A ASSIGNMENT
1500 LET R3=R1[P1]
1510 LET T1[R3,P1]=A
1600 FOR J=0 TO S1-1
1602 LET P4=B2[J]
1610 READ #1,B1[J];R4
1620 LET F1[P4,P1]=R4*16+R3+;
     DEASSIGN NEXT J
1640 LET R1[P1]=R1[P1]+1
1650 LET M1[P1]=M1[P1]-S1
1652 PRINT A,P1,R3,M1[P1],S1,P4
1655 IF E7<N7 GOTO 1940 ! DONT SORT AC LINKED LIST IF
     #ERR <N7
1660 LET P7=N3
1670 LET I=P3[N3]
1680 IF I=P1 GOTO 1940
1690 IF M1[P1]<=M1[I] GOTO 1720
1700 LET P7=I
1710 LET I=P3[I]
1715 GOTO 1680
1720 LET P3[P2]=P3[P1]
1725 LET P3[P7]=P1
1730 LET P3[P1]=I
1940 NEXT X
2200 CLOSE #1,#2,#4,#5
2210 REM -- WRITE PROM FILES
2212 PRINT "*** WRITE PROM FILES***"
2220 OPEN #1,"1/A.ROW"
2230 OPEN #2,"1/A.COL"
2240 OPEN #3,"1/FAULT.DETECT"
2250 OPEN #4,"1/STAT"
2270 FOR I=0 TO N5-1
2280 FOR J=0 TO N3-1
2290 WRITE #1,T1[I,J];I
2300 WRITE #2,T1[I,J];J
2310 NEXT J
2320 NEXT I
2400 FOR J=0 TO N3-1
2410 FOR I=0 TO N4-1
2420 IF F1[I,J]=-1 LET F1[I,J]=0
2430 WRITE #3;F1[I,J]
2440 NEXT I
2450 NEXT J
2490 REM -- UPDATE FROM BURNING AND ADRESS
     TRANSLATION
     SCHEME CONTROL WORD
2500 LET J=1
2510 FOR I=32 TO 36
2520 WRITE #4,0,I;J
2530 NEXT I
2540 FOR I=0 TO N3*N4-1
2545 READ #3,I;F
2550 IF F=0 GOTO 2570 ! UNBURNED STATE =0
2555 LET I1=INT (I/N2)
2560 WRITE #4,0,I1+37;J
2565 LET I=I1*N2+N2-1
2570 NEXT I
2580 LET J=3 ! 4K ADDRESS SCHEME
2590 WRITE #4,0,46;J
3000 CLOSE #1,#2,#3,#4
4000 PRINT "*** ALLOCATION COMPLETED ***"
4010 LET C=1
4100 GOTO 9900
7000 REM -- DEASSIGN PREVIOUS A
7001 IF S5=0 GOTO 7005
7002 FOR I=0 TO S5-1
7003 IF E1[I]=A GOTO 7008
7004 NEXT I
7005 IF S5=64 GOTO 8000
7006 LET E1[S5]=A
7007 LET S5=S5+1
7008 IF X=0 GOTO 8000
7010 LET X1=X-1
7020 READ #5,X1;D
7025 READ #4,D,2;S4
7026 MAT READ #4,-2,4;D1
7027 PRINT "*ASSIGNMENT FAILED IN A =",A;
     DEASSIGN A =",D
7030 FOR I=N5-1 TO 0 STEP -1
7040 LET P1=N3
7042 LET P2=P1
7044 LET P1=P3[P1]
7046 IF P1=N3 GOTO 7070
7050 IF T1[I,P1]=D GOTO 7080
7060 GOTO 7042
7070 NEXT I
7075 PRINT "* ERROR IN PREVIOUS A ASSIGNMENT *"
7077 GOTO 8000
7080 LET T1[I,P1]=-1
7085 LET R1[P2]=R1[P1]-1
7090 LET M1[P1]=M1[P1]+S4
7092 FOR J=0 TO S4-1
7094 READ #2,D1[J];P4
7096 LET F1[P4,P1]=255
```

TABLE V-continued

```
7098 NEXT J
7100 REM -- RE-SORT AC LINKED LIST
7110 LET P7=P1
7120 LET I=P3[P1]
7130 IF I=N3 GOTO 7180
7140 IF M1[P1>=M1[I]GOTO 7180
7150 LET P7=1
7160 LET I=P3[I]
7170 GOTO 7130
7180 IF P7=P1 GOTO 7300
7190 LET P3[P2]=P3[P1]
7200 LET P3[P7]=P1
7210 LET P3[P1]=I
7300 REM -- INTERCHANGE ORDER IN "ASEQ.DAT"
7310 WRITE #5,X1:A
7320 WRITE #5,X:D
7330 LET X=X-1
7331 IF S5=0 GOTO 1040
7332 FOR I=0 TO S5-1
7334 IF E1[I]=D GOTO 7008
7335 NEXT I
7336 GOTO 1040
8000 PRINT
8010 PRINT "*ALLOCATION FAILURE*"
8020 PRINT "M1(I)=";
8022 FOR I=0 TO N3-1
8023 PRINT M1[I];
8024 NEXT I
8032 PRINT
8034 PRINT "F1(I,J):"
8035 FOR I=0 TO N4-1
8036 FOR J=0 TO N3-1
8037 PRINT F1[I,J];
8038 NEXT J
8039 NEXT I
8040 PRINT
8041 PRINT "T1(I,J):"
8042 FOR I=0 TO N5-1
8043 FOR J=0 TO N3-1
8044 PRINT T1[I,J];
8045 NEXT J
8046 NEXT I
8050 PRINT
8100 GOTO 9900
9100 PRINT "*ERROR=";SPC (8)
9110 PRINT "IN LINE";SPC (10)
9800 DATA 1024,512,64,64,16,8,2300
9900 PRINT
9902 PRINT "* TIME ELAPSED =";(SPC) (2)-Z1)*3600+(( SPC (3)-Z2)/10)
9910 IF C=1 CHAIN "1/CLOSE.PH2"
9920 END
```

TABLE VI

TERMS USED IN TABLE V

| | |
|---|---|
| N1 | NA 1024 |
| N2 | NB 512 |
| N3 | NAT 64 |
| N4 | NBT 64 |
| N5 | NAR 16 |
| N6 | NBR 8 |
| N7 | No. of defective addresses below which FPAC(I) linked list will not be updated (2300) |
| S | SB |
| S4 | SD No. of errors on A line be de-assigned |
| S5 | No. of de-assigned A lines |
| Z1 | Initial time value at start of program execution Adtran II |
| Z2 | Initial time value at start of program execution Adtran III |
| SPC | Special IRIS function |
| SPC(8) | Provides error No. for an error message |
| A | Input A line No. |
| B | Input B line No. |
| T,R,E,H | |
| I,J | Temporary variables |
| A1 | AB(I) |
| A2 | BA(I) |
| T1 | TABLE TA(I,T) |
| T2 | TABLE TB(I,J) |

TABLE VI-continued

TERMS USED IN TABLE V

| | |
|---|---|
| Q(I) | No. of errors on each B input line |
| R1 | IAR(J) |
| R2 | IBR(J) |
| R3 | AR |
| R4 | BR |
| R | Temporary record No. for sorting file BSEQ.DAT |
| L1 | LAC(I) 64 |
| L2 | LBC(I) 64 |
| M1 | MAC(I) |
| M2 | MBC(I) |
| E | No. of errors in B line |
| E1(I) | A lines previously de-assigned and not yet re-assigned |
| E7 | Total No. of errors in 516K storage module 23 |
| P1 | PPAC |
| P2 | IPAC |
| P3 | FPAC(I) linked list |
| P4 | IPBC |
| P5 | PPBC |
| P6 | FPBC(I) linked list |
| F1 | F(BC,AC) |
| B1(I) | |
| B2(I) | |
| D | Temporary variable for de-assigned A line No. |
| D1(I) | B lines associated with deleted A line No. |
| C1 | AT address |
| C2 | BT address |

What is claimed is:

1. The method of mapping a subset of elements of a first set of elements into a second set of elements comprising the steps of:

assigning to each element within the first set a different multidigit encoded state from a first set of multidigit encoded states wherein each encoded state is represented by a different combination of multistate digits;

assigning to each element within the second set a different multidigit encoded state from a second set of multidigit encoded states wherein each encoded state is represented by a different combination of multistate digits;

grouping the digits representing the first set of encoded states into a plurality of groups with each group having at least one digit of the digits representing the first set of encoded states and with all of the digits of any given group being mutually exclusive of the digits of any other group, each group of at least one digit having a plurality of different definable group states defined by different combinations of the states of the at least one digit in the group;

storing for each given element of the subset the encoded state from the second set of encoded states assigned to the element of the second set of elements to which the given element is to be mapped, with each digit of the stored encoded state from the second set of encoded states being stored in association with a state of a group, the group state being defined by the state of each of the at least one digit in the group for the encoded state from the first set of encoded states assigned to the given element of the subset;

detecting the occurrence of a multidigit encoded state assigned to an element within the subset; and retrieving the digits representing the encoded state from the second set of encoded states stored in association with the group states defined by the digits of the detected multidigit encoded state.

2. The method of mapping according to claim 1 above, further comprising the steps of:
- outputting as a first subset of the second set of encoded states any occurring encoded state from the first set of encoded states which is not detected as being assigned to an element within the subset of the first set of elements; and
- outputting the retrieved stored digits representing the encoded state from the second set of encoded states as a second subset of the second set of encoded states in response to the occurrence of any encoded state from the first set of encoded states which is detected as being an encoded state assigned to an element within the subset of the first set of elements, the second subset of the second set of encoded states being mutually exclusive of the first subset of the second set of encoded states.

3. The method of mapping a subset of elements of a first set of elements into a second set of elements comprising the steps of:
- assigning each element of the first set to a different point of a multidimensional array having for each dimension a plurality of lines with a plurality of points on each line; and
- storing separately for each dimension of the array and in association with each line in the dimension passing through a point having an element of the subset assigned thereto an encoded state partially identifying an element of the second set, the stored encoded states for each dimension which are associated with any given element of the subset being sufficient in combination to fully identify an element of the second set to which the element of the subset is being mapped.

4. A system for mapping a subset of elements of a first set of elements which are identified by a multipart encoded indicia into a second set of elements in which the elements are represented by a multipart encoded indicia comprising:
- a first translator coupled to receive a first portion of a given multipart encoded indicia identifying an element in the first set and, if the first portion matches a first portion of an encoded indicia for an element in the subset, to generate a first part of a multipart encoded indicia which represents an element within the second set to which the element of the subset is to be mapped;
- a second translator coupled to receive a second portion of the given multipart encoded indicia containing all parts that are not in the first portion and identifying an element in the first set and, if the second portion code matches a second portion of an encoded indicia for an element in the subset, to generate a remainder of the multipart encoded indicia which represents the element within the second set to which the element of the subset is to be mapped; and
- a subset detector coupled to receive the given multipart encoded indicia identifying an element in the first set and to generate a translate command signal when the identified element is an element in the subset.

5. The system according to claim 4 above, wherein the system further comprises a multiplexer coupled to pass the given multipart encoded indicia identifying an element of the first set in the absence of a translate command signal and coupled to pass the multipart indicia identifying the element within the second set to which the element of the subset is to be mapped in response to the translate command signal.

6. The method of mapping selected elements of a first set of elements having each element represented by a different state of a multistate encoded signal into a second set of elements wherein the encoded signal has a plurality of multistate digits and each different signal state is represented by a different combination of digit states, the method comprising the steps of:
- grouping the digits of the encoded signal into a plurality of groups with each group containing at least one digit of the encoded signal and defining a group state by a state of the at least one digit therein such that each element in the first set corresponds to a different combination of group states;
- mapping on a one-to-one basis each group state for each element of the first set into a key code and a translation code that is independent of the key code with each combination of key codes which corresponds to one of the selected elements being distinguishable from any combination of key codes which does not correspond to one of the selected elements; and
- translating an element of the first set represented by the encoded signal to an element of the second set defined by the translation codes to which the group states corresponding to the element being translated have been mapped when the key codes which correspond to the element being mapped are distinguishable as corresponding to one of the selected elements.

7. The method of mapping a particular element from a subset of elements of a first set of elements into a second set of elements comprising the steps of:
- representing the elements of the first set with multidigit encoded input terms uniquely defining each element of the first set;
- grouping the digits of the multidigit encoded input terms representing each element of the first set into a plurality of different groups of digits with the encoded terms of each group defining one of a plurality of different group states for each group;
- mapping the defined states of each group of digits representing each element of the first set onto a different multidimensional array having at least one translation dimension and at least one key dimension with each element of the subset having the defined states which are representative thereof mapped at dimensional states selected to provide a different combination of dimensional states for each element in the subset;
- detecting whether or not the group states for a multidigit code representing a received element have been mapped to a combination of dimensional states which are the same as a combination of dimensional positions for defined state which are representative of an element of the subset; and
- defining the particular element of the first set having group states detected as representative of an element of the subset as an element of the second set represented by a combination of multidigit group states corresponding to dimensional states of the at least one translation dimension to which each defined state of each group of digits representing the particular element is mapped.

8. The method of mapping according to claim 7 above, wherein the detecting step includes the steps of storing in a fault store key dimension states corresponding to mapped states at address locations defined by the at least one translation dimension state for each group state corresponding to an element of the subset, and comparing the key dimension states stored in the fault store at an address defined by translation dimension states to which are mapped the group states for each group of digits representing the particular element of the first set with key dimension states to which are mapped the group states for each group of digits representing the particular element of the first set, the particular element of the first set being detected as being an element at the subset when the comparison indicates equality.

9. The method of mapping according to claim 7 or 8 above wherein there are exactly two different groups of encoded terms.

10. The method of mapping according to claim 7 or 8 above wherein there are exactly three different groups of encoded terms.

11. The method of mapping a given element of a first set of elements to an element of a second set of elements comprising the steps of:

representing each element of the first set by a signal having a different multidigit encoded input signal state for each element, the signal comprising a plurality of ordered digits, each having a predetermined ordinate position with each digit having a plurality of available digit states and being assigned one of the digit states, the digits of each signal state having a predetermined combination of assigned digit states that is different from the combination of assigned digit states of every other input signal state;

grouping the digits of the multidigit encoded input signal into a plurality of different groups with each group having at least one digit, and with the at least one digit in each group forming an encoded group signal having a group signal state defined by the digit states of the at least one digit in the group;

assigning the encoded group signals of each group to a different multidimensional array having at least one multistate translation dimension and at least one multistate key dimension with each of the group signals for any one input signal being assigned to a different array, with group states of group signals assigned to a particular array being assigned to a selected dimensional state for each dimension in the particular array, and with group states of group signals for input signals representing predetermined ones and only predetermined ones of elements of the first set being assigned to a combination of dimensional states designated a translation combination;

detecting whether or not a predetermined relationship exists in which the group signal states for the input signal representing said given element have been assigned to a combination of dimensional states designated a translation combination; and defining the element of the second set to which the given element of the first set is mapped by the translation dimensional states to which the group signals for the input signal representing said given element are assigned in response to detecting the predetermined relationship.

12. The method of mapping according to claim 11 above, wherein the detecting step includes the steps of:

storing the dimensional key states to which are assigned the group states for each group signal for an input signal representing a predetermined element of the first group at address locations that are accessible by the translation dimensional states to which the group states are assigned and comparing the stored key dimensional states with the assigned key dimensional states for the group states of the group signals for the input signal representing the given element to determine whether the predetermined relationship exists.

13. The method of mapping according to claim 12 above, wherein each element of the first set is an address for a memory and each element of the second set is an address for a memory and is different from the element of the first set.

14. The method of mapping according to claim 13 above, further including the step of generating an additional digit signal partially defining each element in the second set and having a first state when the predetermined relationship is detected and a second state different from the first state when the predetermined relationship is not detected.

15. A system for mapping an element in a subset of a first set of elements into a second set of elements by generating an output signal having a state representing an element in the second set of elements in response to an input signal having a state representing an element in the subset, the input signal having a first plurality of multistate digits with each different state of the input signal being defined by different combination of states of the first plurality of multi-state digits and with each element of the first set being represented by a different state of the input signal, the output signal having a second plurality of multistate digits with each different state of the output signal being defined by a different combination of states of the second plurality of multistate digits, the system for mapping comprising;

an A translation store coupled to output an A translation code from a storage location addressed by a received multistate A group address signal comprising an A group of the first plurality of digits, each state of the A group address signal corresponding to a different storage location in the A translation store and being represented by a different combination of states of the A group of digits, the A translation store storing at each addressable storage location an A translation code comprising a plurality of multistate digits with the A translation code stored at each location corresponding to an A group address signal state produced in response to an input signal having a state representing an element in the subset partially representing the second plurality of digits for the output signal that is to be generated in response to the input signal state, an A key store coupled to be addressed by the A group of digits and having an addressable storage location corresponding to each different A group state which addressable storage location stores an A key code having a plurality of multistate digits, the A key code stored at any storage location addressed in response to an input signal having a state representing an element in the subset being operative to distinguish a corresponding A group state from among other A group states addressing the A translation store at address locations storing the same A translation code as that stored in the location addressed in response to the input signal;

a B translation store coupled to output a B translation code from a storage location addressed by a received multistate B group address signal comprising a B group of the first plurality of digits, each state of the B group address signal corresponding to a different storage location in the B translation store and being represented by a different combination of states of the B group of digits, the B translation store storing at each addressable storage location a B translation code comprising a plurality of multistate digits with the B translation code stored at each location corresponding to a B group address signal state produced in response to an input signal having a state representing an element in the subset partially representing the second plurality of digits for the output signal that is to be generated in response to the input signal state;

a B key store coupled to be addressed by the B group of digits and having an addressable storage location corresponding to each different B group state which addressable storage location stores a B key code having a plurality of multistate digits, the B key code stored at any storage location addressed in response to an input signal having a state representing an element in the subset being operative to distinguish a corresponding B group state from among other B group states addressing the B translation store at address locations storing the same B translation code as that stored in the location addressed in response to the input signal; and a relationship detector coupled to respond to A and B translation and key codes generated by the A and B translation and key stores respectively upon receipt by the A and B key and translation stores of A and B group states resulting from an input signal state representing an element in the first set of elements by generating a command signal commanding that the second plurality of digits be output from the system with the second plurality of digits comprising the output A and B translation codes.

16. The system according to claim 15 above, wherein the A and B translation codes each comprise a plurality of binary digits.

17. The system according to claim 15 above, wherein the second plurality of digits further comprises the command signal when the command signal is generated.

18. The system according to claim 15, 16 or 17 above, wherein the relationship detector includes an addressable detector store coupled to receive as an address input concatenated A and B translation codes output by the A and B translation stores respectively, the detector store storing at each location addressed by a concatenation of A and B translation codes A and B key codes corresponding to A and B key codes stored by the A and B key stores respectively at locations addressed by A and B group states respectively for an element of the subset which is to be mapped to an element of the second set represented by the second plurality of digits which comprises the concatenation of A and B translation codes, the detector store outputting an A key code and a B Key code from an addressed location in response to receipt of each address input, and a comparator coupled to compare the A and B key codes output by the A and B key stores with the A and B key codes respectively output by the detector store and generate the command signal when a match is attained.

19. A system for mapping elements within a subset of a first set of elements to a second set of elements comprising:

A key and A translation stores coupled to be accessed by an A group of encoded signals representing one of a plurality of possible A group signal states wherein each possible A group signal state partially represents a plurality of elements of the first set of elements, the A key and A translation stores having a plurality of address locations which are each accessed in response to a different corresponding A group state and store an A key code defining one of a plurality of available A key code states and an A translation code defining one of a plurality of available A translation code states respectively which provide in combination a one-to-one mapping of the corresponding A group state to a selected A map state within a plurality of available A map states defined by different combinations of an A key code state and an A translation code state, the mapping being a unique mapping for each A group state which partially represents an element of the subset;

B key and B translation stores coupled to be addressably accessed by a B group of encoded signals representing one of a plurality of possible B group signal states wherein each possible B group signal state partially represents a plurality of elements of the first set of elements, the B key and B translation stores having a plurality of address locations which are each accessed in response to a different corresponding B group state and store a B key code defining one of a plurality of available B key code states and a B translation code defining one of a plurality of available B translation code states respectively which provide in combination a one-to-one mapping of the corresponding B group state to a selected B map state within a plurality of available B map states defined by different combinations of a B key code state and a B translation code state, the mapping being a unique mapping for each B group state which partially represents an element of the subset; and a relationship detector coupled to respond to accessed A and B key codes by generating a mapping command as an output signal when the accessed key codes indicate that the A and B key stores are addressably accessed by A and B groups of encoded signals respectively which represent an element of the subset.

20. A system for translating an input address represented by a state of an input address signal having a plurality of multistate digits and defining a defective memory location to an output address represented by a state of a multistate output address signal and defining an error free memory location comprising:

A key and A translation stores coupled to be addressably accessed by an A group of the digits of the input address signal and output an A key code and an A translation code in response thereto, the A group having one of a plurality of different A group signal states defined by different combinations of states of the digits in the A group; the A key and translation stores having a storage location for each A group state which corresponds to a defective address location and storing thereat an A key code and an A translation code respectively which in combination provide a unique one-to-one mapping of the A group state which addressably accesses the storage location to an A map state of an A map having a plurality of A map states, each defined by a different combination of an A key code and an A translation code;

B key and B translation stores coupled to be addressably accessed by a B group of the digits of the input address signal and output a B key code and a B translation code in response thereto, the B group having one of a plurality of different B group signal states defined by different combinations of states of the digits in the B group, the B key and translation stores having a storage location for each B group state which corresponds to a defective address location and storing thereat a B key code and a B translation code respectively which in combination provide a unique one-to-one mapping of the B group state which addressably accesses the storage location to a B map state of a B map having a plurality of B map states, each defined by a different combination of a B key code and a B translation code; and a relationship detector coupled to receive the output A and B key and translation codes and generate a command signal commanding translation of the input address to the output address when the received key and translation codes indicate that the A and B groups of input address signals accessing the A and B key and translation stores both correspond to a defective address location.

21. The system according to claim 20 above, wherein the input address signals of the A group are mutually exclusive of the input address signals of the B group.

22. The system according to claim 20 or 21 above, wherein the relationship detector includes a fault store coupled to be addressed by a received fault store address signal including the output A and B translation codes and to output an A and B code pair from an addressable location identified by the received fault store address signal, each storage location storing an A and B key code pair which matches respectively A and B key codes stored by the A and B key stores at locations accessed by respectively an A group and a B group of digits of an input address signal defining a defective memory location, and a comparator coupled to generate the command signal when the A and B key code pair output by the fault store corresponds to A and B key codes output by the A and B key stores respectively.

23. The system according to claim 22 above, wherein the A and B key stores, A and B translation stores and the fault store are all implemented with programmable read only memories.

24. A conditional mapping system comprising:

an A key store coupled to be addressed by an A group of encoded signals and output in response thereto A key code signals;

an A translation store coupled to be addressed by the A group of encoded signals and output in response thereto first and second groups of A translation code signals;

a B key store coupled to be addressed by a B group of encoded signals and output in response thereto B key code signals;

a B translation stored coupled to be addressed by the B group of encoded signals and output in response thereto first and second groups of B translation code signals;

a cross store coupled to be addressed by the first group of A and B translation code signals and to output in response thereto cross code signals;

a fault store coupled to receive the cross code signals and the second group of A and B translation code signals and to output in response thereto A fault key codes and B fault key codes;

a comparator coupled to compare the A key code to the A fault key code, to compare the B key code to the B fault key code, and to generate a command signal indicating that a mapping condition has been detected when the comparisons indicate a predetermined relationship and multiplexing circuitry coupled to receive and output the A and B groups of encoded signals in the absence of the command signal and to receive and output the second group of A and B translation code signals and the cross code signals in response to the command signal.

25. A mapping system comprising:

an A translation store coupled to be addressed by an A group of code signals defining one state out of a plurality of available A group code states and to output an A translation code in response thereto;

a B translation store coupled to be addressed by a B group of code signals defining one state out of a plurality of available B group code states and to output a B translation code in response thereto, the A and B group code signals defining in combination one state out of a plurality of received signal states, predetermined ones of which are to be mapped;

a detector store coupled to be addressed by the A and B groups of code signals and to output in response thereto a command signal commanding the mapping of the A and B group code signals to output A and B translation codes when the A and B groups of code signals define a state which is to be mapped; and a multiplexer coupled to receive as inputs the A and B groups of code signals, the A and B translation codes, and the command signal, the multiplexer outputting the A and B groups of code signals in the absence of the command signal and the A and B translation codes in the presence of the command signal.

26. A mapping system comprising:

an A translation store coupled to receive as address inputs an A group of code signals and to output an A translation code in response thereto;

a B translation store coupled to receive as address inputs a B group of code signals and to output a B translation code in response thereto;

a detector store coupled to receive as address inputs the A and B translation codes and to output in response thereto A and B fault group code signals corresponding to A and B group code states which are to be mapped to states defined by the corresponding A and B translation codes;

a comparator coupled to generate a command signal commanding that the received A and B groups of code signals be mapped to the output A and B translation codes when the A and B group code signals correspond to the A and B fault group code signals respectively; and a multiplexer coupled to receive the A and B group code signals, the A and B translate signals and the command signal and to output in the absence of the command signal the A and B group code signals and to output in response to the command signal the A and B translate code signals.

27. A mapping system comprising:

A, B and C key stores coupled to receive as address inputs respectively A, B and C groups of coded input signals and to output A, B and C key code signals respectively in response thereto;

A, B and C translation stores coupled to receive as address inputs respectively the A, B and C groups of coded input signals and to output A, B and C translation code signals respectively in response thereto;

a detector store coupled to receive the A, B and C translate code signals as address inputs and to output A, B and C detector key signals in response thereto; and a comparator coupled to receive the A, B and C key code signals and the A, B and C detector key code signals and to generate a mapping command signal when said respective signals have a predetermined relationship; and a multiplexer coupled to receive as inputs the A, B and C groups of coded input signals, the output A, B and C translation code signals and the command signal, the multiplexer operating to provide the A, B and C group code signals as system outputs in the absence of the command signal and the A, B and C translation code signals as system outputs in response to the command signal.

28. The method of mapping selected received states of a multistate input signal having a plurality of multistate digits with each different combination of digit states defining a different state of the input signal into a state of a multistate output signal having a plurality of multistate digits with each different combination of digit states defining a different state of the output signal, the method comprising the steps of:

grouping the digits of the input signal into a plurality of groups with each group containing at least one digit of the input signal and defining a group state by a state of the at least one digit therein such that each input signal state corresponds to a different combination of group states;

assigning a key code and a translation code to each group state which corresponds to an input signal state with each combination of key codes assigned to the group states corresponding to a selected input signal state being distinguishable from any combination of key codes assigned to a group state which does not correspond to a selected input signal state; and translating a received input signal state to an output signal state defined by digits thereof having digit states representing the translation codes assigned to the group states corresponding to the received input signal state when the combination of key codes assigned to the group states corresponding to the received input signal state is distinguishable as corresponding to a selected input signal state.

* * * * *

UNITED STATES PATENT AND TRADEMARK OFFICE
CERTIFICATE OF CORRECTION

PATENT NO. : 4,497,020

DATED : January 29, 1985

INVENTOR(S) : Thomas J. Gilligan

Page 1 of 3

It is certified that error appears in the above-identified patent and that said Letters Patent is hereby corrected as shown below:

```
Column  1, line 55, after "memory" insert --,--.
Column  2, line 46, after "code" delete --state--;
           line 58, before "a second" (first
                   occurrence) delete --a--;
           line 66, change "codes" to --code--.
Column  4, line 35, change "lines" to --line--;
           line 42, delete "Al-" and insert --A12--;
           line 43, delete "2";
           line 65, change "0-AI16" to --0-AI18--.
Column  7, line 51, change "FK4ΩFK6" to --FK4-FK6--.
Column  9, line 13, delete "seelect" and insert
                   --select--.
Column 12, line  9, change "(AT-" to --"AT0--;
           line 10, delete "0".
Column 13, line 57, change "corresponds" to
                   --correspond--.
Column 16, lines 3 and 4, change "AT4-8-AT63" to --AT48
                   -AT63--.
Column 17, line 50, change "conflict" to --conflicts--.
Column 20, line 41, capitalize "Basic".
Column 22, line 14, change "obtained" to --obtains--.
```

UNITED STATES PATENT AND TRADEMARK OFFICE
CERTIFICATE OF CORRECTION

PATENT NO. : 4,497,020

DATED : January 29, 1985

INVENTOR(S) : Thomas J. Gilligan

Page 2 of 3

It is certified that error appears in the above-identified patent and that said Letters Patent is hereby corrected as shown below:

```
Column 27, line  3, change "assumed" to --assigned--;
           line 34, change "100 OPEN #2," to --110 OPEN #2,--.
Column 28, line  8, change "##3" to --#3--;
           line 33, between "3000" and "1024" insert --DATA--.
Column 30, line 32, delete the data instruction after "7140"
                    and insert --IF M2[P4]=M2[I] GOTO 7180--;
           line 52, before "NEXT J" insert --8090--;
           line 53, change "8090" to --8100--;
           line 54, change "8100" to --8200--;
           line 55, change "8200" to --9000--;
           line 56, change "9000" to --9100--;
           line 57, change "9100" to --9110--;
           line 58, change "9110" to --9800--;
           line 59, change "9800" to --9900--.
Column 31, line 13, in instruction "350", between "(8)" and
                    "52" insert --≠-- (not equal);
           line 64, after "R3+" delete ";" and insert --128--;
           line 65, insert the numeral --1636-- for the
                    instruction and before "NEXT J" delete
                    "DEASSIGN".
```

UNITED STATES PATENT AND TRADEMARK OFFICE
CERTIFICATE OF CORRECTION

PATENT NO. : 4,497,020

DATED : January 29, 1985

INVENTOR(S) : Thomas J. Gilligan

It is certified that error appears in the above-identified patent and that said Letters Patent is hereby corrected as shown below:

Column 32, line 28, correct the spelling of "address".
Column 33, line 7, change "M1[P1>" to --M1[P1]<--;
  line 41, change "(SPC) (2) - Z1" to --(SPC (2) - Z1)--.
Column 35, line 52, delete "code".
Column 37, line 12, change "at" to --of--.
Column 38, line 29, after "defined by" insert --a--;
  line 55, after "state" change "," to --;--.
Column 43, line 19, change "translate" to --translation--;
  line 20, change "key signals" to --key code signals--.

Signed and Sealed this

Twenty-ninth Day of October 1985

[SEAL]

Attest:

*Attesting Officer*

DONALD J. QUIGG

*Commissioner of Patents and Trademarks—Designate*